US008830761B2

(12) United States Patent
La Rosa et al.

(10) Patent No.: US 8,830,761 B2
(45) Date of Patent: Sep. 9, 2014

(54) METHOD OF READING AND WRITING NONVOLATILE MEMORY CELLS

(71) Applicant: STMicroelectronics (Rousset) SAS, Rousset (FR)

(72) Inventors: Francesco La Rosa, Rousset (FR); Olivier Pizzuto, Rousset (FR); Stephan Niel, Greasque (FR); Philippe Boivin, Venelles (FR); Pascal Fornara, Pourrieres (FR); Laurent Lopez, Rousset (FR); Arnaud Regnier, Les Taillades (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 4 days.

(21) Appl. No.: 13/786,202

(22) Filed: Mar. 5, 2013

(65) Prior Publication Data
US 2013/0229875 A1  Sep. 5, 2013

(30) Foreign Application Priority Data

Mar. 5, 2012  (FR) ...................................... 12 51969

(51) Int. Cl.
| | | |
|---|---|---|
| G11C 16/26 | (2006.01) | |
| G11C 16/24 | (2006.01) | |
| G11C 16/34 | (2006.01) | |
| G11C 16/14 | (2006.01) | |
| G11C 16/08 | (2006.01) | |
| H01L 29/423 | (2006.01) | |
| H01L 29/788 | (2006.01) | |
| H01L 27/115 | (2006.01) | |
| G11C 16/04 | (2006.01) | |
| G11C 11/56 | (2006.01) | |
| G11C 8/12 | (2006.01) | |

(52) U.S. Cl.
CPC .............. *G11C 16/26* (2013.01); *G11C 16/14* (2013.01); *G11C 16/0483* (2013.01); *G11C 11/5642* (2013.01); *G11C 16/24* (2013.01); *G11C 8/12* (2013.01); *G11C 16/0433* (2013.01); *G11C 16/08* (2013.01); *H01L 29/42328* (2013.01); *H01L 29/7881* (2013.01); *H01L 27/11524* (2013.01); *H01L 27/11556* (2013.01)
USPC ............. 365/185.21; 365/185.17; 365/185.18

(58) Field of Classification Search
CPC .... G11C 16/26; G11C 16/0483; G11C 16/24; G11C 11/5642
USPC ........................... 365/185.17, 185.18, 185.21
See application file for complete search history.

(56) References Cited

U.S. PATENT DOCUMENTS

| | | |
|---|---|---|
| 6,906,376 B1 | 6/2005 | Hsu et al. |
| 2002/0153546 A1 | 10/2002 | Verhaar |
| 2004/0130947 A1 | 7/2004 | Fan et al. |
| 2008/0080244 A1 | 4/2008 | Lee et al. |
| 2008/0165582 A1 | 7/2008 | Georgescu et al. |
| 2009/0003074 A1 | 1/2009 | Georgescu et al. |
| 2009/0158226 A1 | 6/2009 | Ho et al. |

*Primary Examiner* — Ly D Pham
(74) *Attorney, Agent, or Firm* — Seed IP Law Group PLLC

(57) ABSTRACT

The disclosure relates to a method of reading and writing memory cells, each including a charge accumulation transistor in series with selection transistor, including applying a selection voltage to a gate of the selection transistor of the memory cell; applying a read voltage to a control gate of the charge accumulation transistor of the memory cell; applying the selection voltage to a gate of the selection transistor of a second memory cell coupled to the same bitline; and applying an inhibition voltage to a control gate of the charge accumulation transistor of the second memory cell, to maintain the transistor in a blocked state.

20 Claims, 16 Drawing Sheets

US 8,830,761 B2

METHOD OF READING AND WRITING NONVOLATILE MEMORY CELLS

BACKGROUND

1. Technical Field

The present disclosure relates to nonvolatile memories in integrated circuits on semiconductor chips. More particularly, the present disclosure relates to memories comprising memory cells with programming and erasure by tunneling, called Uniform Channel Program or UCP. More particularly, the present disclosure relates to UCP memory cells with two transistors, comprising a selection transistor and a charge accumulation transistor, such as a floating gate transistor.

2. Description of the Related Art

FIG. 1 is a schematic cross-sectional view of two memory cells C11, C12 of UCP type, fabricated on a P-type substrate PW. Each memory cell C11, C12 comprises a floating gate transistor FGT11, FGT12 and a selection transistor ST11, ST12. Each floating gate transistor comprises a drain region n1 (D), a source region n2 (S), a floating gate FG, a control gate CG, and a channel region CH1 extending under the floating gate FG between the drain n1 and source n2 regions. Each selection transistor ST11, ST12 comprises a drain region n2 (D) common to the source region n2 of the corresponding floating gate transistor FGT11, FGT12, a source region n3 (S), a gate SG, and a channel region CH2 extending under the gate SG between the drain n2 and source n3 regions. The two transistors ST11, ST12 share the same source region n3.

Regions n1, n2, n3 are generally formed by N doping of the substrate PW. The substrate is generally a P-type well formed in a semiconductor wafer WF. The well PW is isolated from the rest of the wafer WF by an N-doped isolation layer NISO that surrounds the entire well. The gates FG, SG are generally of a first layer of polycrystalline silicon "poly1", and are formed on the substrate PW by means of oxide layers D1, D2, layer D1 being a tunneling oxide layer whereas layer D2 is a gate oxide layer. The control gate CG is generally of a second layer of polycrystalline silicon "poly2", and is formed on the floating gate FG over an oxide layer D3.

The two memory cells are covered by a dielectric isolating material D0, which may also be of oxide SiO2. The drain regions n1 of transistors FGT11, FGT12 are coupled to a same bitline BL by means of a contact C1 traversing the isolation D0 to reach an intermediary conductor T1 of a first layer of metal "metal1", and of a conductive via V1 traversing the isolation D0 to couple the conductor T1 to the bitline BL in a second layer of metal "metal2". The source region n3 common to the two transistors ST11, ST12 is coupled to a source line SL by means of a contact C2 traversing the isolation D0, the source line SL being for example in the first metal layer.

In relation with FIG. 2, table REF1 in Annex describes the voltages applied to the memory cells C11, C12, FIG. 2 showing their equivalent electrical diagram. In relation with FIG. 3, table RD1 in Annex describes voltages values applied to the memory cells during a read of the memory cell C11. Column "Ref." describes the reference attributed to each voltage value, and the column "Ex." describes example voltage values. Reference "GND" is the ground potential, that is, the potential of wafer WF, generally 0V.

Thus, during a read of cell C11, the selection transistor ST12 receives the blocking voltage Voff and is not conducting. A current (represented by an arrow in FIG. 3) flows through the channel region CH1 of the transistor FGT11 and through the channel region CH2 of the transistor ST11. This current is representative of the threshold voltage of the transistor FGT11. The threshold voltage is representative of a programmed or erased state of the transistor, which depends on a quantity of electrical charges stored in its floating gate. This current is sensed by a sense amplifier, not shown in the figure, which supplies a binary data stored by the cell C11.

The selection transistor ST12 being blocked by the voltage Voff, the value of the voltage "no-read" Vnread applied to the floating gate transistor FGT12 is unimportant because this transistor is isolated from the source region n3 by the transistor ST12. In the table RD1, this voltage is chosen to be equal to the biasing voltage VB1 of the substrate PW, here the ground potential GND.

Cells C11, C12 have the advantage of being programmable or erasable by application of a pair of determined voltages to the substrate PW and to the control gate CG of their transistor FGT11, FGT12. This programming or erasing mode is called "programming and erasing by the channel". To give an idea, table ER1 in Annex discloses voltage values applied to the memory cells during erasure of the cell C11. Table PG1 in Annex discloses voltage values applied to memory cells during programming of the cell C11. Reference "HZ" designates the high impedance state (open circuit).

The transfer of charges from the substrate PW to the floating gate FG (programming) or from the floating gate to the substrate (erasure) is done without using the selection transistor ST11, by applying a high voltage difference (here 15V) allowing this charge transfer. Thus, the steps of programming, erasure, and read are performed with low value voltages by exploiting the potential difference between the substrate and the control gate of floating gate transistors. Thus, the selection transistors ST11, ST12 are not subjected to high voltages, which allows memory cells C11, C12 to be provided that are simple to design and do not occupy a lot of semiconductor surface area.

Despite the advantages offered by such UCP memory cells, it may be desired to provide a means allowing their surface area to be decreased even further, in order to reduce the surface area of a memory array comprising a plurality of such memory cells. It may also be desired to provide a memory structure of small surface area.

BRIEF SUMMARY

Embodiments of the disclosure relate to a method of reading and writing memory cells implanted in a semiconductor substrate and each comprising a charge accumulation transistor in series with selection transistor The method includes reading a first memory cell by: applying a read biasing voltage to a bitline to which the memory cell is coupled; applying a selection voltage to a gate of the selection transistor of the memory cell; applying a read voltage to a control gate of the charge accumulation transistor of the memory cell; and sensing a current flowing in the memory cell. The method further comprises, during the read of the first memory cell: applying the selection voltage to a gate of the selection transistor of a second memory cell coupled to the same bitline; and applying an inhibition voltage to a control gate of the charge accumulation transistor of the second memory cell, to maintain the transistor in a blocked state.

According to one embodiment, the selection voltage is applied to the gates of selection transistors of the first and second memory cells by means of a wordline common to the two memory cells.

According to one embodiment, the substrate is a well delimited by an isolation layer, comprising using the isolation layer as a source line of the selection transistors of the first and second memory cells.

According to one embodiment, the method comprises a preliminary step of forming, in the semiconductor substrate, a buried vertical gate forming a common gate of the selection transistor of the first memory cell and of the selection transistor of the second memory cell, and comprising: reading the first memory cell, during which a current flows through a conductive channel of the selection transistor of the first memory cell extending in front of a first face of the common gate; and reading the second memory cell, during which a current flows through a conductive channel of the selection transistor of the second memory cell extending in front of a second face of the common gate.

According to one embodiment, the method comprises a step of erasing the first memory cell comprising: applying an erasure biasing voltage to the substrate; applying an erasure voltage to the control gate of the charge accumulation transistor of the first memory cell, to cause an electrical field to appear between the substrate and the control gate to extract electrical charges by tunnel effect; applying an erasure inhibition voltage to the control gate of the charge accumulation transistor of the second memory cell; and applying a same voltage to the gate of the selection transistor of the first memory cell and to the gate of the selection transistor of the second memory cell.

According to one embodiment, the method comprises a step of programming the first memory cell comprising: applying an erase biasing voltage to the substrate; applying a programming voltage to the control gate of the charge accumulation transistor of the first memory cell, to cause an electrical field to appear between the control gate and the substrate to inject electrical charges by tunnel effect; applying a programming inhibition voltage to the control gate of the charge accumulation transistor of the second memory cell; and applying a same voltage to the gate of the selection transistor of the first memory cell and to the gate of the selection transistor of the second memory cell.

According to one embodiment, the method is applied to a memory comprising at least one first row and a second row of memory cells and comprises: providing a common wordline coupled to the gates of the selection transistors of memory cells of the first row and of the second row; and applying the same voltage to the gates of selection transistors of memory cells of the first page and of the second page during the read, erase, or program of memory cells of a page, by means of the common wordline.

Embodiments of the disclosure relate to an integrated circuit comprising a memory on a semiconductor substrate, the memory comprising: memory cells, each comprising a charge accumulation transistor in series with a selection transistor; and means for reading and writing memory cells. During the read of a first memory cell, the means for reading and writing are configured to: apply a read biasing voltage to a bitline to which the memory cell is coupled; apply a selection voltage to a gate of the selection transistor of the memory cell; apply a read voltage to a control gate of the charge accumulation transistor of the memory cell; and sense a current flowing in the memory cell. During the read of the first memory cell, the means for reading and writing are configured to: apply the selection voltage to a gate of the selection transistor of a second memory cell coupled to the same bitline; and apply an inhibition voltage to a control gate of the charge accumulation transistor of the second memory cell, to maintain the transistor in a blocked state.

According to one embodiment, the means of reading and writing are configured to apply the selection voltage to the gates of selection transistors of the first and second memory cells, by means of a wordline common to the two memory cells.

According to one embodiment, the memory cells are implanted in a well delimited by an isolation layer forming the source line of selection transistors of the memory cells.

According to one embodiment, the memory comprises a buried vertical gate forming a common gate of the selection transistor of the first memory cell and of the selection transistor of the second memory cell, the selection transistor of the first memory cell comprising a channel region extending in front of a first face of the common gate, the selection transistor of the second memory cell comprising a channel region extending in front of a second face of the common gate.

According to one embodiment, the memory comprises: at least one first row and one a second row of memory cells; a common wordline coupled to the gates of selection transistors of memory cells of the first row and of the second row; and wherein the means of reading and writing are configured to, during the reading, erasing, or programming of memory cells of a row of memory cells, apply the same voltage to the gates of selection transistors of memory cells of the first row and of the second row by means of the common wordline.

According to one embodiment, the memory is configured to allow simultaneous erasure of a row of memory cells, and comprises a first control gate line coupled to the charge accumulation transistors of memory cells of the first row; a second control gate line coupled to the charge accumulation transistors of memory cells of the second row; and wherein the means of reading and writing are configured to, during the erasure of a row of memory cells: apply an erase biasing voltage to the substrate; apply an erase voltage to the first control gate line; and apply an erase inhibition voltage to the second control gate line.

According to one embodiment, the memory is configured to allow simultaneous erasure of a group of memory cells of a row without erasing other memory cells of the row, and comprises: wells, each receiving a group of memory cells of the first and second rows; a main control gate line for the memory cells of each row; and a control gate line for each group of memory cells of each row, the control gate line coupled to the charge accumulation transistors of memory cells of the group.

According to one embodiment, the memory comprises selection switches of groups of memory cells, each switch configured to couple the main control gate line to the control gate line of a group of memory cells, and arranged in a dedicated well distinct of wells receiving the groups of memory cells.

BRIEF DESCRIPTION OF THE SEVERAL VIEWS OF THE DRAWINGS

Embodiments of a method of reading memory cells, memory cells structures, and memory structures according to the disclosure will be described in the following in a non-limiting manner, in relation with the appended drawings in which.

DETAILED DESCRIPTION

Figure 1:
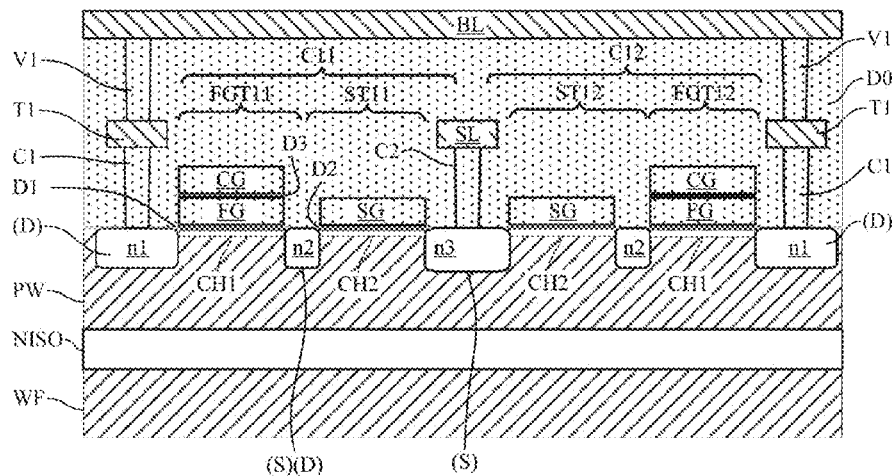
FIG. 1, previously described, is a schematic cross-sectional view of two conventional memory cells, FIG. 2, previously described, is the electric diagram of the memory cells, FIG. 3, previously described, shows a conventional read method of a memory cell of the pair of memory cells of FIG. 1.
Figure 2:
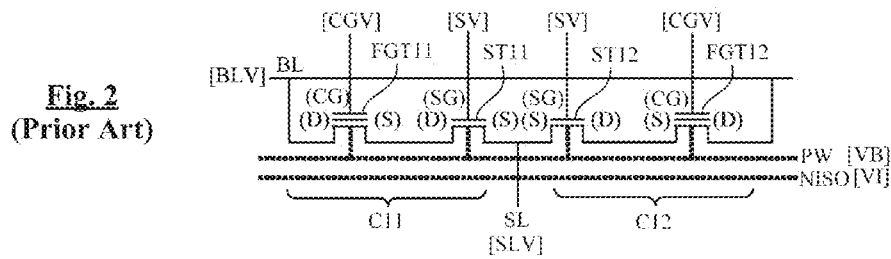
Figure 3:
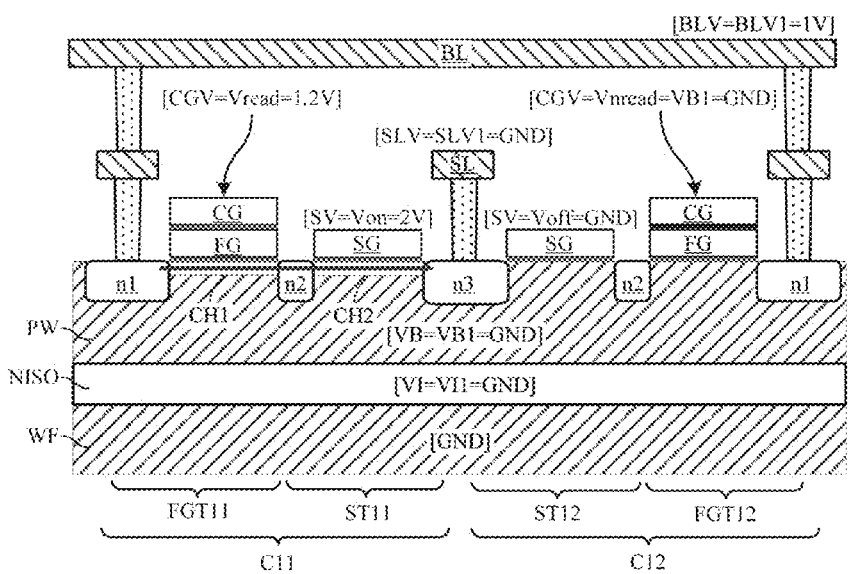
Figure 4:
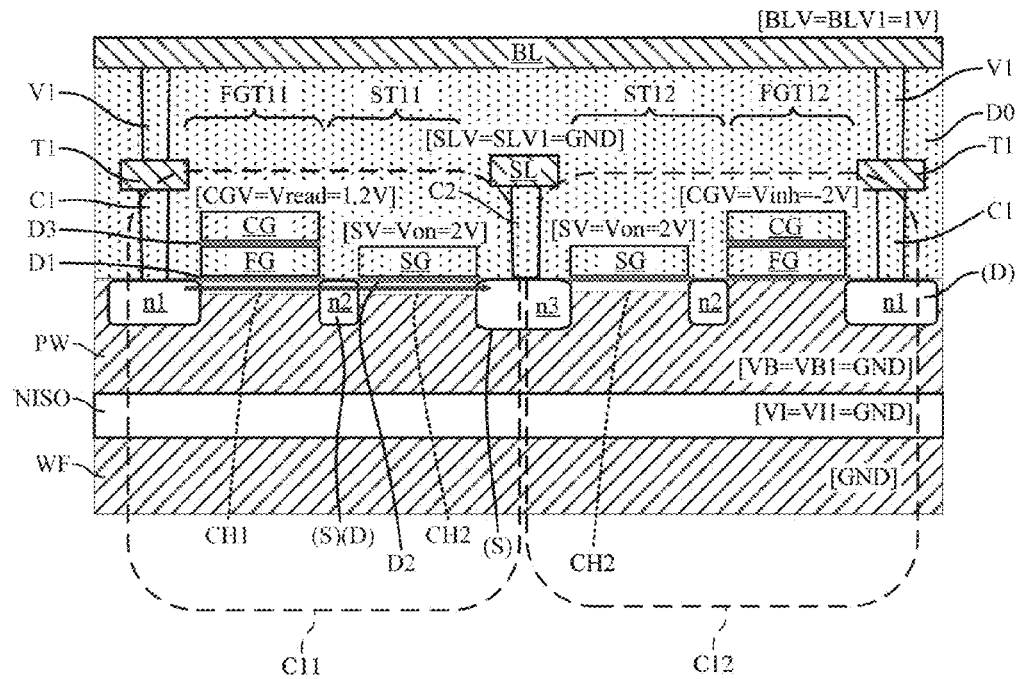
FIG. 4 shows a method according to the disclosure of reading a memory cell of the pair of conventional memory cells of FIG. 1.

In relation with FIG. 4, table RD2 in Annex describes a method according to one embodiment of the disclosure of reading the memory cells C11, C12 shown in FIG. 1. The voltages listed in the first column of the table were previously described in relation with the table REF1. The example described here relates to the read of the memory cell C11. The cell C12 may be read in a similar manner by applying to it the voltages applied to the cell C11, and vice-versa.

The read method produces an effect similar to that described by the table RD 1: the cell C11 is conducting and is traversed by a current that also traverses the bitline BL. This current is sensed by a sense amplifier (not shown).

This method differs from that described by the table RD1 in that the gates of the two selection transistors ST11 and ST12 receive the selection voltage during read Von, the non-selection voltage during read Voff no longer being used for the considered pair of memory cells. Thus, the selection transistor ST12 of the cell C12 is set in the conducting state and has a conductive channel in its channel region CH2. To prevent a current from flowing through the non-selected cell C12, the voltage CGV applied to the control gate of the transistor FGT12, instead of being equal to the non-read voltage Vnread, is equal to an inhibition voltage Vinh, which forces the transistor FGT12 into the blocked state and prevents it from conducting. The inhibition voltage Vinh, here negative, is chosen to be less than the lowest possible value of the threshold voltage of the transistor FGT12 in order to ensure that the transistor FGT12 remains in the blocked state. The threshold voltage is a function of the state of the transistor, programmed or erased. In other words, the selection transistor ST12, usually used for the selection for read of a memory cell, is no longer used for its usual function for the pair of memory cells considered, and the floating gate transistor FGT12 is forced into the blocked state.

Thus, a feature of this read method is that the voltages applied to the gates of the selection transistors ST11, ST12 are identical no matter which memory cell is read in the pair of memory cells. It will be noted that this feature of the read method concerns two neighboring memory cells forming a pair, that is to say, sharing the same source region and coupled to the same bitline. In general, it relates to two rows of memory cells constituted of neighboring memory cells coupled to the same group of bitlines. This feature does not relate to other memory cells, the selection transistors of which are conventionally set in the blocked state during the read of one of these memory cells.

This feature brings together two other features that appear in the tables ER1 and PG1, that is, the voltages applied to the gates of selection transistors ST11, ST12 during the erasure or the programming of a memory cell of the pair of memory cells, are themselves identical, regardless of whether the memory cell is erased or programmed. By combining these features, it appears that the two selection transistors of a pair of memory cells may receive the same voltage regardless of the process to perform (read, erase, or program), and regardless of which memory cell is the object of this process. This combination of features allows structural modifications of pairs of memory cells in order to decrease their surface area, as will now be described.

Figure 5:
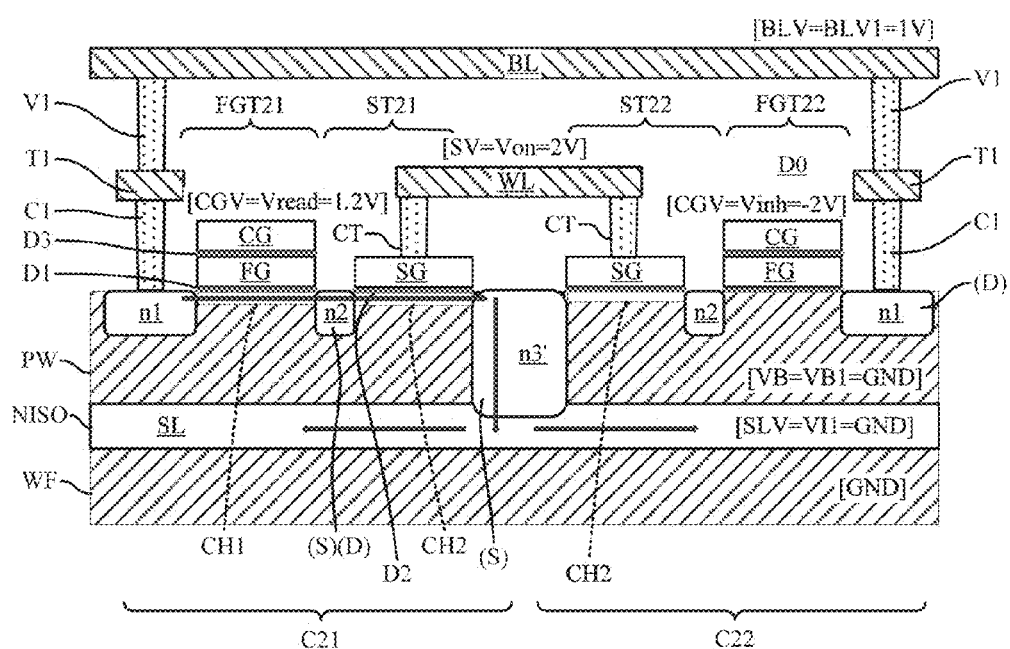
FIG. 5 is a schematic cross-sectional view of a first embodiment of memory cells according to the disclosure.

FIG. 5 shows a pair of memory cells C21, C22 according to the an embodiment. Each memory cell C21, C22 comprises a floating gate transistor FGT21, FGT22 and a selection transistor ST21, ST22. The structure of memory cells C21, C22 is identical to that of the memory cells C11, C12 with the exception of two features:

1) The gates SG of the selection transistors ST21, ST22 are coupled to a common wordline WL. The wordline WL is for example formed in the first metal layer "metal1" and is coupled to the gates of the transistors by contacts CT traversing the dielectric layer D0 that covers the two memory cells.

2) The conventional source line SL (Cf. FIG. 4) is not present. The source region n3 of the transistors ST11, ST12 shown in FIG. 4 is replaced by a source region n3' of the transistors ST21, ST22 that is deeper than the source region n3 and reaches the buried layer NISO delimiting the well PW in which the two memory cells are implanted.

Thus, the source region n3' and the layer NISO are at the same electrical potential, and the layer NISO is used as a source line SL.

These two features are independent of each other and are shown in the same drawing merely for convenience. The absence of the source line and its replacement by the layer NISO allows the structure to be simplified of higher metal layers. Moreover, as the layer NISO has the form of a plate delimited by vertical sidewalls, it has a lower electrical resistance than a layer of doped semiconductor in the form of a strip.

The feasibility of using the layer NISO as a source line may be demonstrated by considering, in the tables RD2, ER1 and PG1, the electrical voltages applied to the source line SL and to the layer NISO:

1) Table RD2 shows that the electrical potential SLV of the source line is the same as the potential VI of the layer NISO during the read of a memory cell, that is, the ground potential GND. Thus, the layer NISO may be used as a source line during the read of a memory cell.

2) Table ER1 shows that, during erasure of a memory cell, the source line voltage SLV is brought to a potential SLV2=HZ (high impedance), whereas the voltage VI of the layer NISO is brought to a potential VI2=5V. Nevertheless, the selection transistors are not conducting because the voltage SV applied to their gates (SV=SV2=5V) is identical to that of the substrate (VB=VB2=5V), such that no conductive channel can form in their channel region CH2. In these conditions, the source line SL may be brought to the potential of the layer NISO instead of being set to high impedance, without the erase process being affected. It is thus equally possible to use the layer NISO as a source line during an erase process without modifying its potential, so that its isolation function, which employs this potential, may be conserved.

3) Finally, table PG1 shows that during the programming of a memory cell, the voltage SLV of the source line is brought to a potential SLV2=HZ (high impedance) whereas the voltage VI of the layer NISO is brought to a potential VI2=GND. As the selection transistors are also not conducting during the programming of the memory cell, the source line SL may be brought to the ground potential GND instead of being set to high impedance, without the programming process being disturbed. It is therefore also possible to use the layer NISO as the source line during the programming process without modifying its potential.

Table REF2 in Annex describes the voltages applied to the memory cells C21, C22. Except for the references attributed to the different transistors, table REF2 is identical to the table REF1. The voltage NISO is no longer present and is considered as forming the source line voltage SLV.

In relation with FIG. 5, table RD3 in Annex describes voltage values applied to the memory cells during the read of the memory cell C21. Except for the references attributed to the different transistors, the read method is identical to that described by the table RD2.

Figure 6:
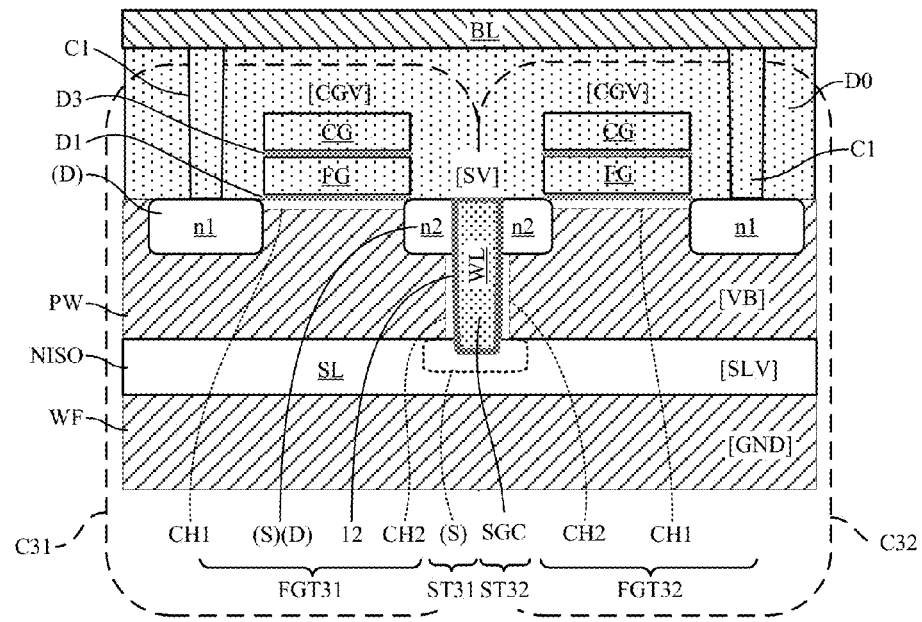
FIG. 6 is a schematic cross-sectional view of a second embodiment of memory cells according to the disclosure.

FIG. 6 shows another structure of a pair of memory cells C31, C32 according to the disclosure. Each memory cell C31, C32 comprises a floating gate transistor FGT31, FGT32 and a selection transistor ST31, ST32. The transistors FGT31, FGT32 are of the same structure as the transistors FGT21, FGT22 and each has a horizontal channel region CH1 extending beneath its floating gate FG, between the drain n1 and source n2 regions. The selection transistors ST31, ST32 are distinguished from the selection transistors ST21, ST22 of FIG. 5 in that they comprise a common vertical gate SGC. This vertical gate SGC is buried in the substrate PW and is electrically isolated from adjacent structures by means of an isolating layer 12, for example of oxide SiO2, forming a gate oxide of the selection transistors ST31, ST32. It extends longitudinally vertically into the substrate PW from an upper surface of the substrate PW and has lower left and right edges that penetrate into the layer NISO. The layer NISO thus forms, in its portion surrounding the lower left and right edges of the gate SGC, the source region (S) of the transistors ST31, ST32. As previously, the layer NISO also forms the source line SL of these transistors. The drain regions n2 (D) of the transistors ST31, ST32 (which also form the source regions of floating gate transistors) are conserved, but respectively extend along an upper left edge and an upper right edge of the gate SGC.

Thus, the transistor ST31 has a vertical channel region CH2 that extends in front of the left vertical wall of the gate SGC, between the first region n2 and the layer NISO. Similarly, the transistor ST32 has a vertical channel region CH2 that extends in front of the right vertical wall of the gate SGC, between the second region n2 and the layer NISO.

With respect to the structure of the pair of memory cells C21, C22, the structure of the pair of memory cells C31, C32 has the advantage of occupying much less semiconductor substrate surface area, due to the absence at the surface of the substrate of the selection transistors ST31, ST32, which are now buried transistors having a common gate.

As it will be seen later in light of fabrication method examples, the vertical gate SGC is formed from a conductive trench that couples several pairs of memory cells, shown in cross-section in FIG. 6. According to the fabrication method implemented, this trench may have no electrical discontinuity. It may therefore be used directly as a wordline WL, as indicated by the reference "WL" in FIG. 6. In other embodiments, this trench may be severed into different segments by isolation trenches STI ("Shallow Trench Isolation") described later. In this case, each vertical gate SGC of each pair of memory cells or group of memory cells coupled to a given segment is independent of the others and must be individually coupled to a wordline in a metal layer.

Figure 7:
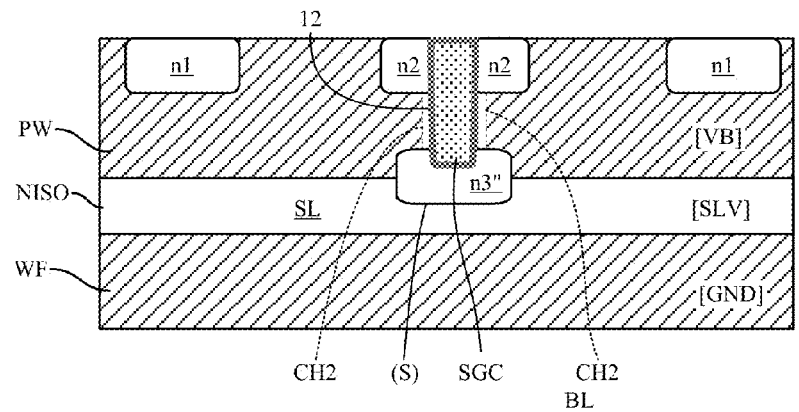
FIG. 7 shows an implementation variation of an element of the memory cells of FIG. 6.

FIG. 7 shows an embodiment in which the vertical gate SGC does not extend deep enough into the substrate PW to reach the layer NISO. A doped region n3" is therefore implanted between the lower extremity of the gate SGC and the layer NISO. The region n3" surrounds the lower left and right edges of the gate SGC and forms the source region (S) of the transistors ST31, ST32. The region n3" extends until the layer NISO that it electrically couples to the source region of the transistors ST31, ST32.

Figure 8:
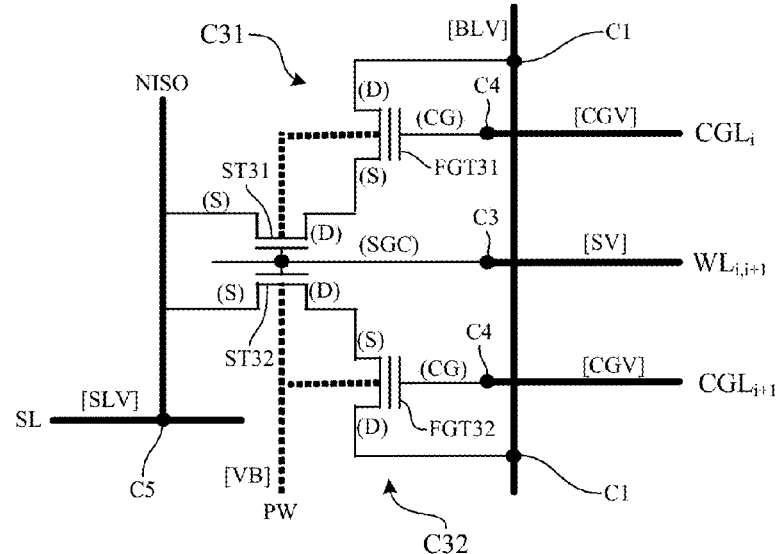
FIG. 8 is the electrical diagram of the memory cells of FIG. 6.

FIG. 8 is the electrical diagram of memory cells C31, C32. The control gate of the transistor FGT31 is coupled to a control gate line $CGL_i$ by means of a contact C4. The control gate of the transistor FGT32 is coupled to a control gate line $CGL_{i+1}$ by means of a contact C4. The drain regions (D) of transistors FGT31, FGT32 are coupled to a bitline BL by means of contacts C1. The vertical gate SGC is coupled to a wordline $WL_{i,i+1}$ common to two memory cells by means of a contact C3. Alternatively, the vertical gate SGC may itself form the wordline $WL_{i,i+1}$, as indicated above. The channel regions of the transistors FGT31, FGT32, ST31, ST32 are at the electrical potential of the well PW, as shown by dotted lines. Finally, the source regions (S) of the transistors ST31, ST32 are electrically coupled to the layer NISO forming the source line, which may be coupled by means of a contact C5 to a general source line SL formed in a metal layer.

In relation with FIG. 6, table REF3 in Annex describes the voltages applied to the memory cells C31, C32. Except the references attributed to different transistors, table REF3 is identical to the table REF2. The voltage SLV is now a unique voltage applied to the common gate SGC of the transistors ST31, T32.

Figure 9:
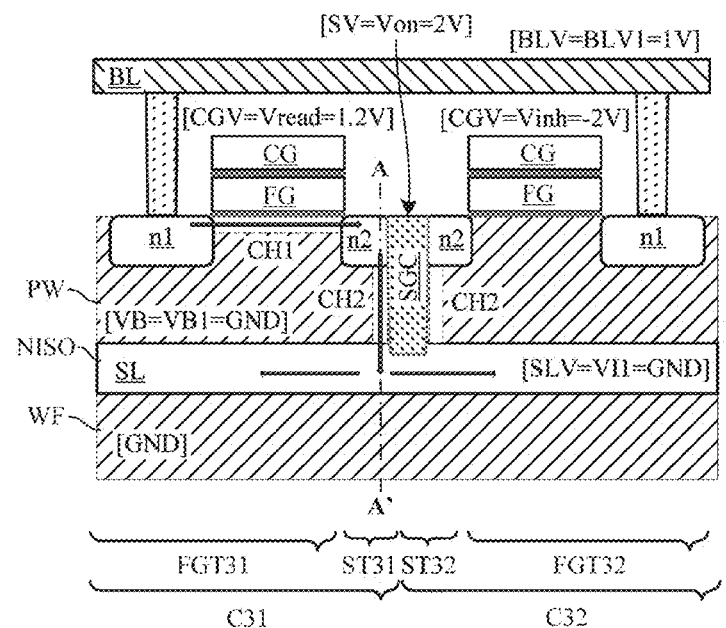
FIG. 9 shows a method according to the disclosure of reading a memory cell of the pair of memory cells of FIG. 6.

In relation with FIG. 9, table RD4 in Annex describes voltage values applied to the memory cells during the read of the memory cell C31. Table RD4 is identical to table RD3 except for the references of the memory cells and of the transistors. Thus, in read, the memory cells C31, C32 are equivalent to the memory cells C21, C22.

In FIG. 9, arrows show a current traversing the channel region CH1 of the transistor FGT31 and the vertical channel region CH2 of the transistor ST31. A conductive channel also appears in the vertical channel region CH2 of the transistor ST32, under the effect of the voltage SV=Von applied to the common gate SGC, but the associated floating gate transistor FGT32 remains blocked under the effect of the inhibition voltage Vinh.

Figure 10:
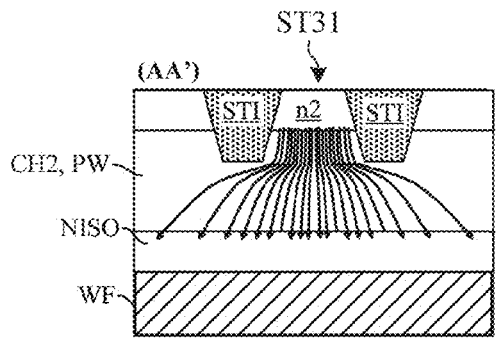
FIG. 10 is a transversal cross-sectional view of an element of FIG. 9, FIGS. 11 and 12 respectively show steps of erasing and of programming a memory cell of the pair of memory cells of FIG. 6.

FIG. 10 is a transversal cross-sectional view of the transistor ST31 along the cutting axis AA' shown in FIG. 9. The cutting plane traverses the drain region n2 of the transistor, the vertical channel region CH2 that extends in the substrate PW, the layer NISO, and the wafer WF. It may be seen that the transistor is formed between two isolation trenches STI, which do not reach the layer NISO here. Arrows show the distribution of current in the channel region CH2, between the drain region n2 and the source region formed by the layer NISO. The channel region has a narrow portion between the two trenches STI and a portion of indeterminate width where the current lines are no longer channeled by the trenches STI and spread out until they reach the layer NISO. Contrary to a conventional selection transistor, the transistor ST31 has a conductive channel of variable width.

Figure 11:
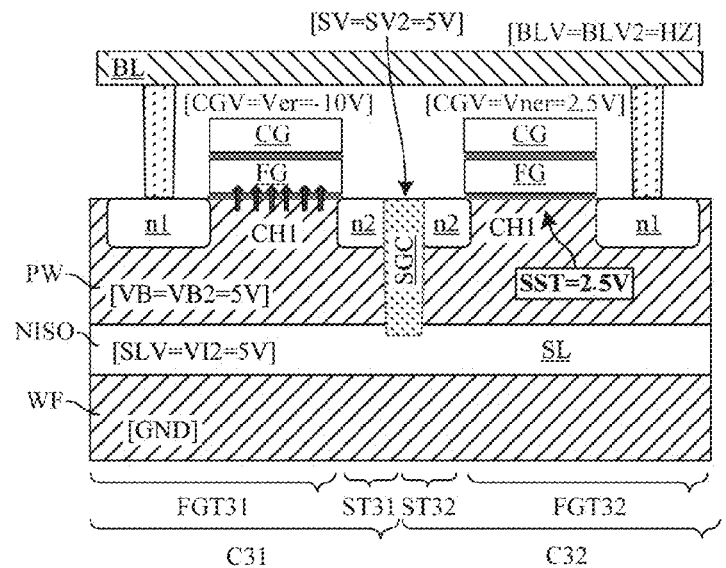

In relation with FIG. 11, table ER2 in Annex describes voltage values applied to memory cells during the erasure of the memory cell C31. The erasing method described by the table ER2 differs from that described by the table ER1 in that the voltage SLV of the source line, formed by the layer NISO, is equal to the voltage VI2 applied to the layer NISO in the method described by the table ER1.

In FIG. 11, arrows show that an electrical field appears between the substrate PW and the floating gate FG of the transistor FGT31. This electrical field extracts electrons from the floating gate by tunnel effect (the Fowler Nordheim effect). Moreover, the transistor FGT32 is subjected to a "Soft Stress" SST due to the potential difference between the substrate PW and its control gate, here equal to 2.5 V. This soft stress effect is insufficient to extract significant electrical charges from the floating gate of this transistor.

Figure 12:
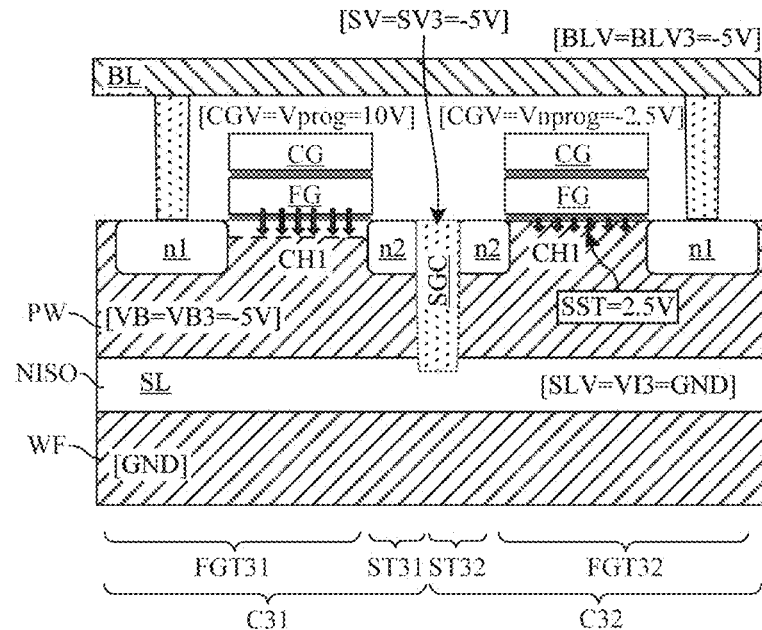

In relation with FIG. 12, table PG2 in Annex describes voltage values applied to the memory cells during the programming of the memory cell C31. The method of programming described by the table PG2 differs from that described by the table PG1 in that the source line voltage SLV, formed by the layer NISO, is equal to the voltage VI3 applied to the layer NISO in the method described by the table PG1.

In FIG. 12, arrows show that an electrical field appears between the substrate PW and the floating gate FG of the transistor FGT31. This electrical field causes a conductive channel to appear in the channel region CH1 of the transistor FGT31, and causes the injection of electrons into the floating gate by tunnel effect (the Fowler Nordheim effect). Moreover, the transistor FGT32 is subjected to a soft stress effect SST due to the potential difference between the substrate PW and its control gate, here equal to −2.5 V. This soft stress effect is insufficient to inject electrical charges into the floating gate of this transistor.

Figure 13:
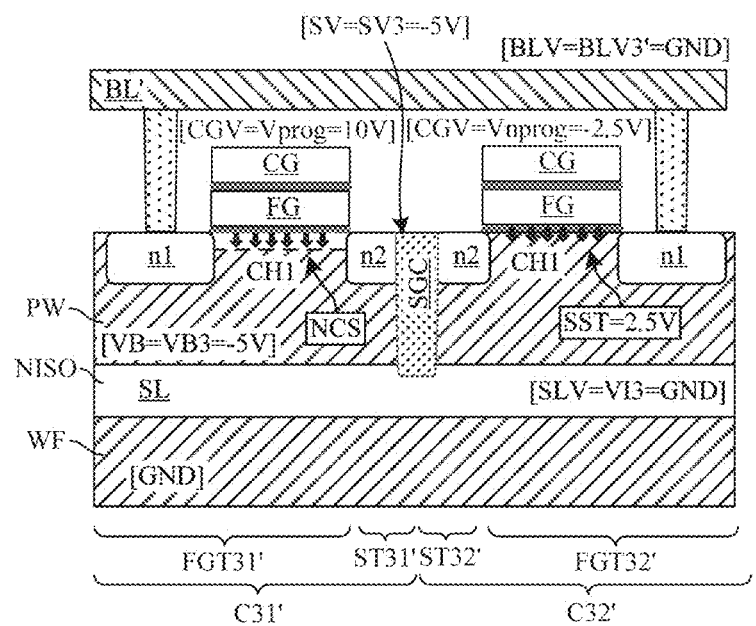
FIG. 13 shows voltages sustained by neighboring memory cells during the programming step of FIG. 12, FIGS. 14A to 14E are cross-sectional views showing steps of a method according to the disclosure of fabricating memory cells.

In relation with FIG. 13, table PG2' in Annex describes voltage values sustained by neighboring memory cells C31', C32' during the step of programming the memory cell C31 shown in FIG. 12. These neighboring memory cells C31', C32' are coupled to the same wordline and to the same control gate lines as the memory cells C31, C32, but are coupled to a different bitline BL'. With respect to the cutting plane of FIG. 12, these memory cells C31', C32' are "in front of" or "behind" the memory cells C31, C32 of FIG. 12.

These memory cells are subjected to the same voltages as the memory cells C31, C32, except for the bitline voltage BLV, which is brought to a non-programming voltage BLV3', for example the ground potential GND.

The transistor FGT32' is subjected to a soft stress effect SST due to the difference in potential between the substrate PW and its control gate, here equal to −2.5 V. This soft stress effect is insufficient to inject electrical charges into the floating gate of this transistor. The transistor FGT31' is subjected to a non cumulative stress NCS due to the potential difference of 15V between the substrate PW and its control gate. Nevertheless, as its drain region n1 is coupled to ground by means of the bitline BL', the conductive channel created in its channel region CH1 is maintained at 0V and limits the injection of electrons into its floating gate. This stress effect, in and of itself, is known in the prior art as "non-cumulative" because it only affects the memory cells coupled to the same control gate line as the transistor being programmed. Therefore, such stress is generally tolerated.

Thus, it has been demonstrated in the preceding that the memory cells UCP comprising a buried vertical gate SGC and a source line formed by the isolation layer NISO may be used to form a memory. It has also been demonstrated that such memory cells do not have more usage constraints than conventional UCP memory cells in read, erase, and program, particularly in terms of soft stress SST or non cumulative stress NCS.

FIGS. 14A to 14E show, by cross-sectional views, steps of a method of fabricating vertical gates of selection transistors according to the disclosure. During a step S10, FIG. 14A, an N-doped isolation layer NISO is implanted in the wafer WF, to delimit a P-type well PW forming a substrate. The vertical sidewalls of the isolation layer NISO are not shown in the cross-sectional view of FIG. 14A, which only shows a portion of the wafer. Optionally, a P-doped layer is also implanted in the well, above the layer NISO. This layer allows adjustment of the threshold voltages of the selection transistors ST31, ST32 previously described, as well as the threshold voltage of blank cells (the threshold voltage of floating gate transistors in the absence of electrical charges trapped in their floating gates).

Figure 14A:
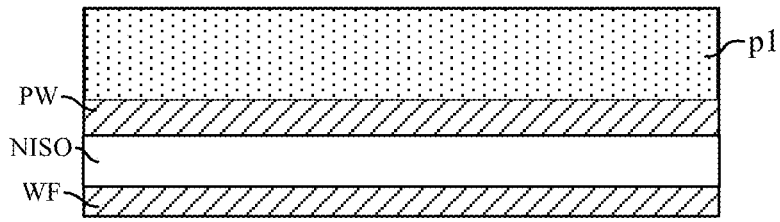
Figure 14B:
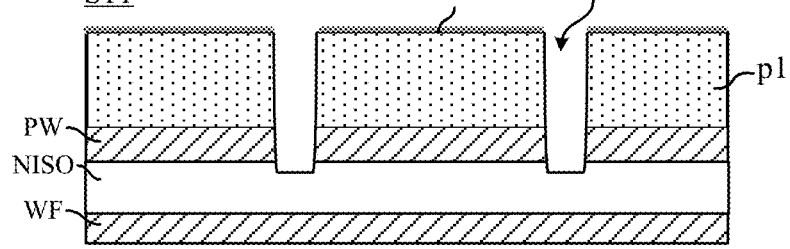
Figure 14C:
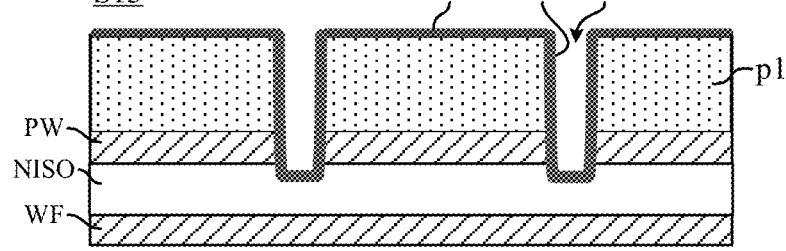
Figure 14D:
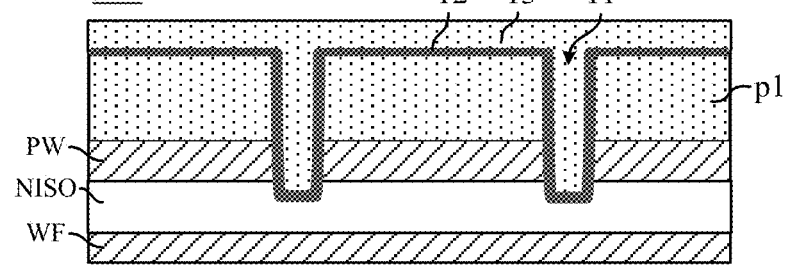

During a step S11, FIG. 14B, an etching mask 10 is deposited on the surface of the substrate PW. Parallel trenches 11 are etched in the substrate by means of the etching mask. Here, the trenches are sufficiently deep to reach the layer NISO. During a step S13, FIG. 14C, the etching mask is removed and a gate oxide layer 12 is deposited on the surface of the substrate PW and in the trenches 11. During a step S14, FIG. 14D, a layer of polycrystalline silicon 13 is deposited on the surface of the substrate PW and in the trenches 11, above the oxide layer 12.

Figure 14E:
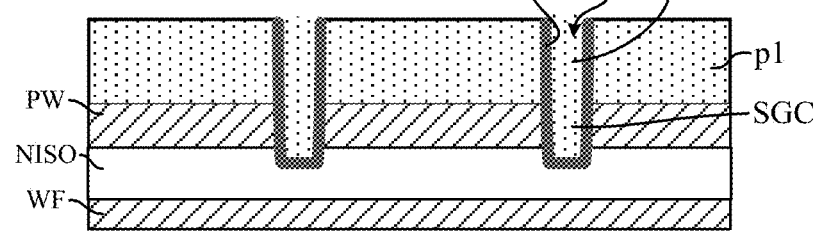

During a step S15, FIG. 14E, the layer of polycrystalline silicon 13 and the oxide layer 12 are removed from the surface of the substrate PW, so that the surface of the substrate is ready for other fabrication steps, described later. The conductive trenches 11 in polycrystalline silicon 13 remain, isolated from the substrate by the oxide layer 12 and destined to form vertical gates SGC such as that shown in FIG. 6.

Figure 15A:
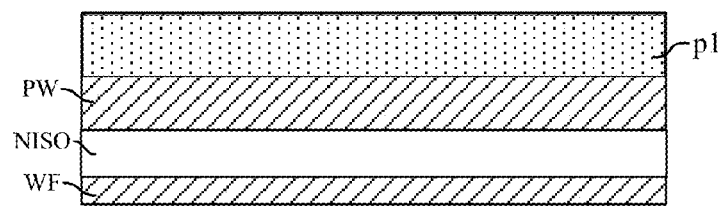
FIGS. 15A to 15F are cross-sectional views showing a variation of steps shown in FIGS. 14A to 14E, FIGS. 16A to 16E are top views showing other steps of a method according to the disclosure of fabricating memory cells.
Figure 15B:
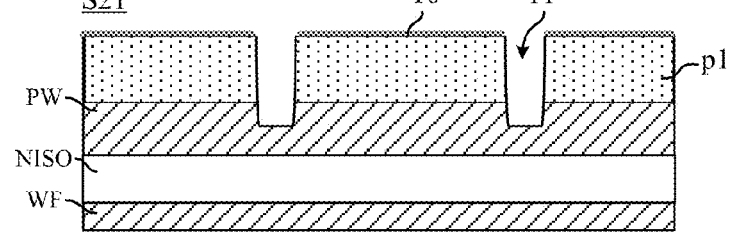
Figure 15C:
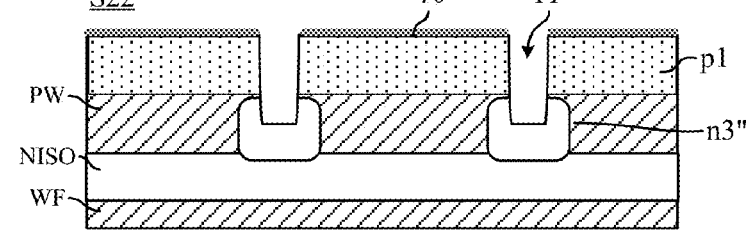
Figure 15D:
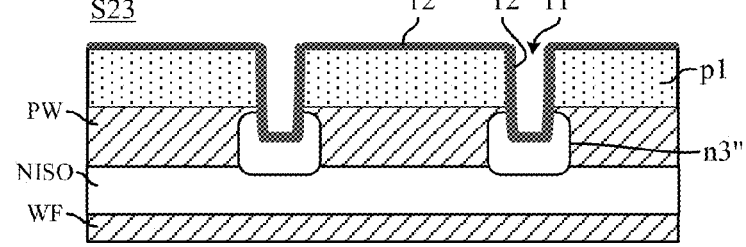
Figure 15E:
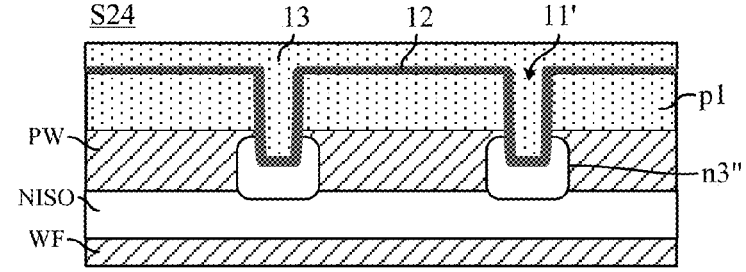
Figure 15F:
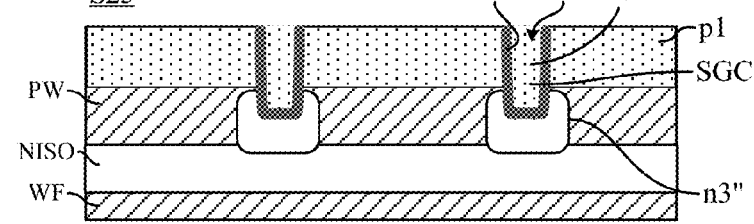

FIGS. 15A to 15F show, by cross-sectional views, a variation of the method of fabrication that has just been described. The method comprises steps S20, S21, S22, S23, S24, and S25. Step S20, FIG. 15A, is identical to step S10 previously described. Step S21, FIG. 15B, is identical to step S11 previously described but here shallower trenches 11' that do not reach the layer NISO are formed. Step S22, FIG. 15C, consists of implanting pockets n3" of N-doped semiconductor around the lower portion of the trenches 11'. These pockets will form the source regions n3" of selection transistors, previously described in relation with FIG. 7. The pockets n3" are for example implanted by passing through the inside and the bottom of the trenches, and are sufficiently deep to reach the layer NISO. The steps S23, S24, S25, FIGS. 15D, 15E, 15F, are identical to the steps S13, S14, S15 previously described. At the end of these steps, conductive trenches 11' in polycrystalline silicon are obtained, isolated from the substrate by the oxide layer 12, which will form vertical gates SGC such as that shown in FIG. 7. These trenches do not reach the layer NISO but their lower portion is surrounded by pockets n3" which reach the layer NISO.

Steps of a method of fabricating memory cells in an integrated circuit are shown in FIGS. 16A to 16E by top views. This method aims to collectively fabricate memory cells, to obtain a memory of the type described later in relation with FIGS. 25 and 26. During a step S30, FIG. 16A, conductive trenches $SGC_{i,i+1}$, $SGC_{i+2,i+3}$ are formed in the substrate PW. The conductive trenches are parallel between themselves and are isolated from the substrate. The trenches are formed according to one of the two methods of fabrication which have just been described. For the sake of simplicity, only two trenches are shown. These trenches, marked with indices (i, i+1) and (i+2, i+3), relate to the fabrication of four pages or of four words of ranks i, i+1, i+2, and i+3.

Figure 16A:
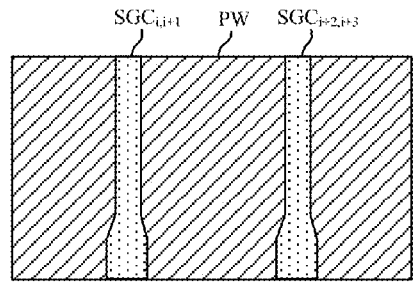
Figure 16B:
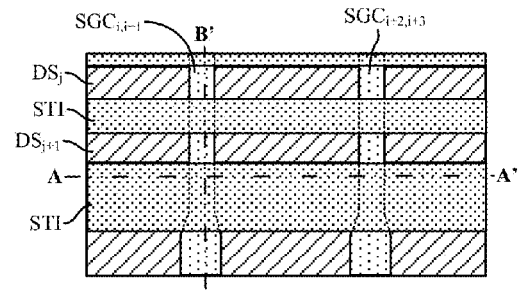

During a step S31, FIG. 16B, shallow trench isolations STI are formed perpendicular to the conductive trenches $SGC_{i,i+1}$, $SGC_{i+2,i+3}$. The trenches are parallel between themselves and are formed by etching the semiconductor and filling the obtained trenches with oxide. They cause semiconductor strips $DS_j$, $DS_{j+1}$ to appear in the semiconductor, perpendicular to the conductive trenches $SGC_{i,i+1}$, $SGC_{i+2,i+3}$, which are destined to later form the drain and source regions of transistors.

Figure 17A:
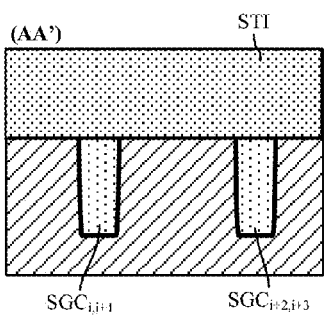
FIGS. 17A, 17B are cross-sectional views of a step shown in FIG. 16B, FIGS. 18A to 18E are top views showing a variation of steps shown in the FIGS. 16A to 16E, FIGS. 19A, 19B are cross-sectional views of a step shown in FIG. 18B.
Figure 17B:
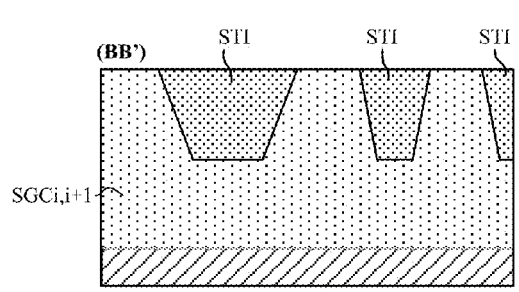

The etching of trenches STI also etches the conductive trenches $SGC_{i,i+1}$, $SGC_{i+2,i+3}$ in junction zones. To give an idea, FIGS. 17A and 17B are longitudinal and transversal cross-sectional views of trenches STI along the cutting axes AA' and BB' shown in FIG. 16B. The isolation trenches STI are not as deep as the conductive trenches $SGC_{i,i+1}$, $SGC_{i+2,i+3}$ and form conductive sections separated by the trenches STI in the conductive trenches. Each section is destined to form a vertical gate SGC common to two selection transistors. As may be seen in FIG. 17B, these sections are electrically coupled between themselves by the sections of the conductive trenches that are not severed by the isolation trenches STI and extend beneath them. In one embodiment, not shown, the isolation trenches STI completely sever the conductive trenches and the different sections obtained are not electrically coupled.

Figure 16C:
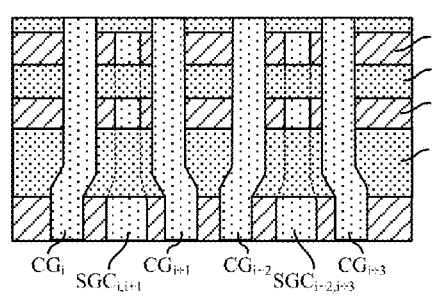

During a step S32, FIG. 16C, conductive lines $CG_i$, $CG_{i+1}$, $CG_{i+2}$, $CG_{i+3}$ parallel to the conductive trenches $SGC_{i,i+1}$, $SGC_{i+2,i+3}$ are formed at the surface of the substrate PW, two conductive lines per conductive trench, one conductive line being placed to the left and the other being placed to the right of the conductive trench. These conductive lines are formed by the deposition of a second layer of polycrystalline silicon "poly2", then etching the poly into strips. The conductive lines are destined to form both the control gates of floating gate transistor and control gate lines CGL. Step S32 is preceded by steps of forming the floating gates, which are not shown in the drawings, performed after the step S31. These steps comprise depositing a tunnel oxide layer at the surface of the substrate, depositing a first layer of polycrystalline silicon "poly1", etching the layer "poly1" to form floating gates, then depositing a layer of oxide at the surface of the substrate, for example of the type ONO (Oxide-Nitride-Oxide), upon which the conductive lines $CG_i$ to $CG_{i+3}$ are formed.

Figure 16D:
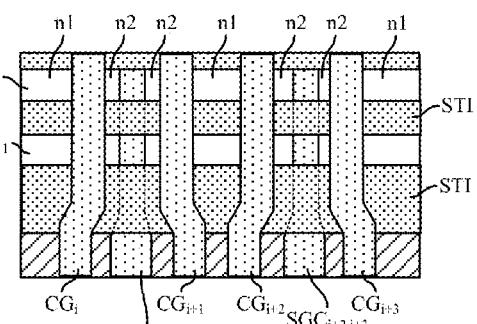

During a step S33, FIG. 16D, N-type dopants are implanted in the semiconductor strips $DS_j$, $DS_{j+1}$, to form drain n1 and source n2 regions of floating gate transistors. The source regions n2, which extend to the right and to the left of the conductive trenches $SGC_{i,i+1}$, $SGC_{i+2,i+3}$, also form drain regions of selection transistors, in conformance with the memory cell structure shown in FIG. 6.

Figure 16E:
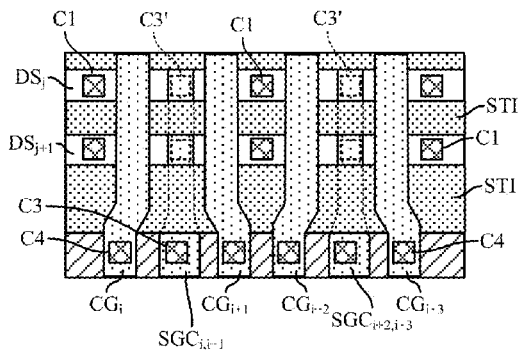

During a step S34, FIG. 16E, the ensemble of the substrate including the conductive lines $CG_i$, $CG_{i+1}$, $CG_{i+2}$, $CG_{i+3}$, is covered by the dielectric layer D0 cited above. This dielectric layer is not shown in the drawing so that the elements it covers may be seen. Holes are formed in the dielectric layer, and then holes are metalized to form the contacts C1, C3, C4 (Cf. FIG. 8) destined to couple the elements that have just been formed to conductive metal tracks. Thus, the contacts C1 are destined to couple the drain regions n1 to bitlines. The contacts C4 are destined to couple the conductive lines $CG_i$, $CG_{i+1}$, $CG_{i+2}$, $CG_{i+3}$ to a gate control circuit. The contacts C3 are destined to couple the conductive trenches $SGC_{i,i+1}$, $SGC_{i+2,i+3}$ to a wordline driver circuit. More precisely, if the conductive trenches are completely severed by the isolation trenches STI, the contacts C3 allow them to be coupled to metal wordlines that lead to the wordline driver circuit. In this case, supplementary contacts C3' are provided to couple, to the wordlines, the sections formed by the severed conductive trenches. Inversely, if the conductive trenches are not completely severed, they may be used as wordlines. The contacts C3 allow them to be coupled to the wordline driver circuit.

The steps that have just been described are followed by steps of forming metal lines as set forth below, or interconnection lines allowing memory cells to be coupled to control elements of the integrated circuit. These steps are in and of themselves conventional and will not be described.

Figure 18A:
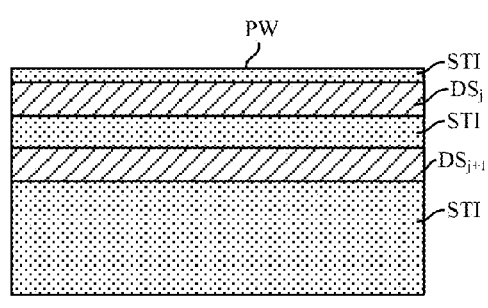
Figure 18B:
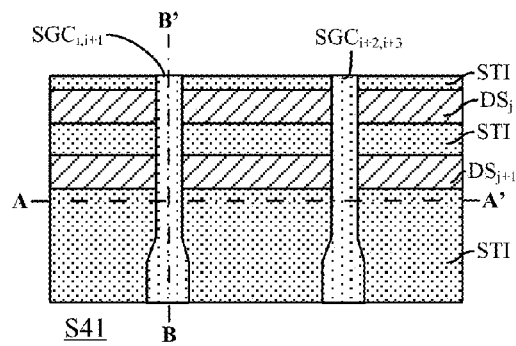
Figure 18C:
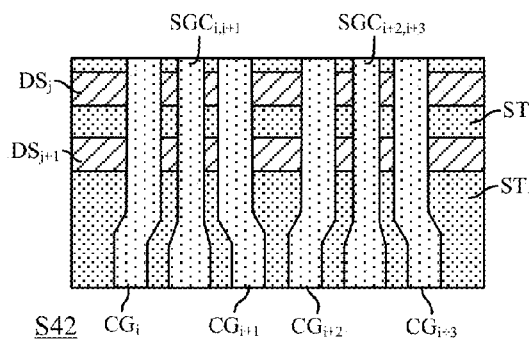
Figure 18D:
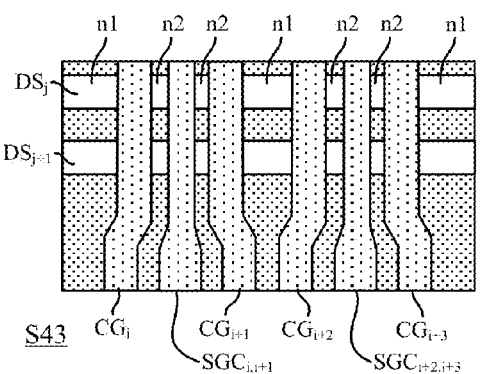
Figure 18E:
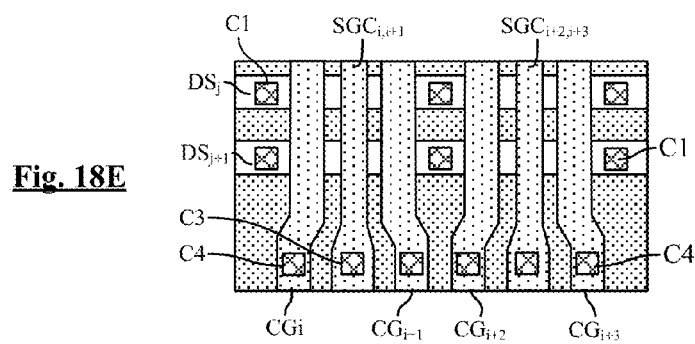
Figure 19A:
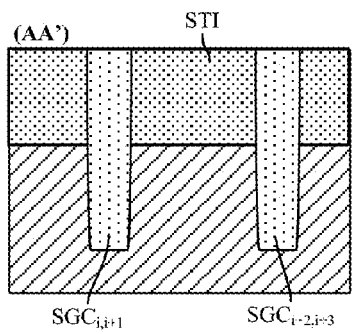
Figure 19B:
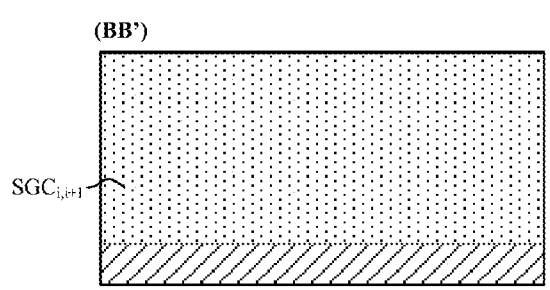

A variation of this method of fabricating memory cells is shown in FIGS. 18A to 18E. The isolation trenches STI are formed first, during a step S40 shown in FIG. 18A. During a step S41, FIG. 18B, the conductive trenches $SGC_{i,i+1}$, $SGC_{i+2,i+3}$ are formed. Thus, here, the conductive trenches sever the isolation trenches STI. FIGS. 19A and 19B are longitudinal and transversal cross-sectional views of the conductive trenches, along the axes AA' and BB' shown in FIG. 18B. The conductive trenches $SGC_{i,i+1}$, $SGC_{i+2,i+3}$ are deeper than the isolation trenches STI and sever them entirely (FIG. 19A). In an implementation variation, the isolation trenches are deeper than the conductive trenches and only partially sever them. In these two cases, the electrical continuity of the conductive trenches is complete throughout their entire depths (FIG. 19B).

The other steps of this method of fabrication are identical to those described above. FIGS. 18C, 18D, 18E differ from FIGS. 16C, 16D, 16E only in that the conductive trenches $SGC_{i,i+1}$, $SGC_{i+2,i+3}$ sever the isolation trenches STI instead of being severed by them. Thus, the method comprises a step S42, FIG. 18C, of forming conductive lines $CG_i$, $CG_{i+1}$, $CG_{i+2}$, $CG_{i+3}$ preceded by steps of forming floating gates and of oxide deposition not shown, a step S43, FIG. 18D, of forming drain n1 and source n2 regions of floating gate transistors, and a step S44, FIG. 18E, of forming contacts C1, C3, C4, the supplementary contacts C3' not being necessary here.

Figure 20:
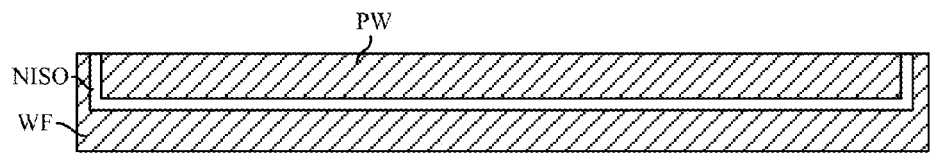
FIG. 20 is a cross-sectional view of a well receiving memory cells.
Figure 21:
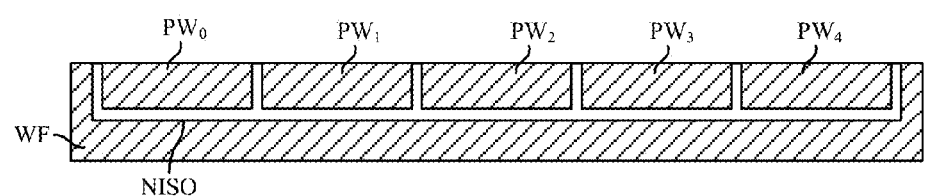
FIG. 21 is a cross-sectional view of a plurality of wells receiving memory cells.

FIG. 20 shows a step of forming the layer NISO, which delimits the well PW, in the wafer WF. The layer NISO is formed by two implantations of N-type dopants. A first implantation allows a horizontal "plate" of doped semiconductor to be formed, which delimits the bottom of the well PW. A second implantation allows the vertical sidewalls of the well PW to be formed. In an implementation variation shown in FIG. 21, the layer NISO comprises a plurality of sidewalls which delimit a plurality of wells $PW_0$, $PW_1$, $PW_2$, etc. It will be seen in what follows that certain embodiments of a memory according to the disclosure employ such a plurality of wells, each being able to be brought to an electrical potential different than the others.

Figure 22:
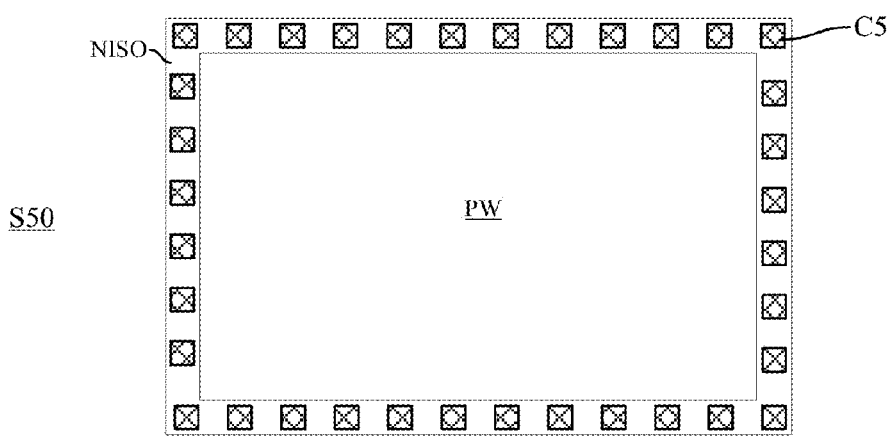
FIG. 22 is a top view of a well.

FIG. 22 shows a step of forming contacts C5 on the upper part of walls of the isolation layer NISO, at the surface of the substrate. This step may be done at the same time as the step of forming the contacts C1, C3, C4 shown in FIG. 16E or 18E. As the layer NISO is used as a source line, numerous contacts C5 are preferably provided all along the upper part of walls of the layer NISO, as shown in the figure, in order to decrease its electrical resistance and to favor the distribution of current lines in all directions. As indicated above, the contacts C5 allow the layer NISO to be coupled to a general source line SL formed in a metal layer, or to control elements of the source line voltage.

Figure 23:
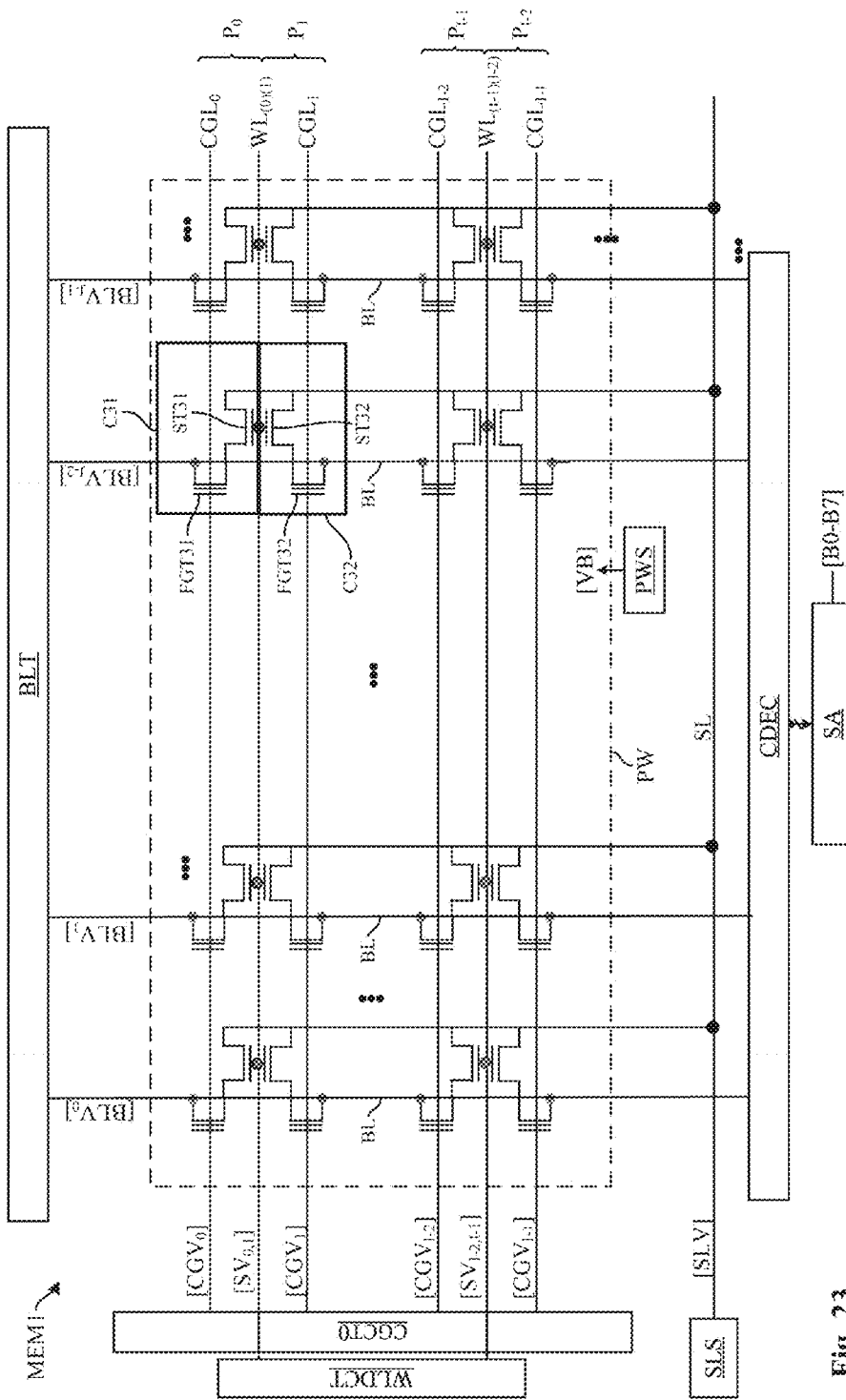
FIG. 23 is the electrical diagram of a page-erasable memory according to the disclosure.

FIG. 23 shows a page-erasable memory MEM1 comprising a memory array formed in a well PW, according to one embodiment. The memory array comprises I×J memory cells C31, C32, each memory cell C31, C32 comprising a charge accumulation transistor FGT31, FGT32 in series with a selection transistor ST31, ST32.

The memory comprises I pages P, each comprising a row of J memory cells, and a control gate line CGL. FIG. 23 shows the two first pages P0, P1 of ranks 0 and 1, and the two last pages of ranks I-2 and I-1. The memory also comprises J bitlines BL, each bitline being coupled to memory cells of the same rank J belonging to different pages. FIG. 23 shows the two first bitlines of ranks 0 and 1, and the two last bitlines of ranks J-2 and J-1. Each bitline BL is coupled to drain regions of floating gate transistors FGT of memory cells of the same rank j, whereas each control gate line CGL is coupled to control gates of transistors FGT of memory cells of the same rank i. The source regions of selection transistors are coupled to the layer NISO that surrounds the well PW.

The memory thus comprises wordlines WL that are coupled to the gates of selection transistors ST of memory cells. Each wordline WL controls the common selection gate of memory cells of two neighboring or "linked" pages, while a corresponding pair of control gate lines CGL is coupled to the control gates of transistors FGT of respective ones of the linked pages. Thus, a wordline WL of rank (0)(1) is associated with the two first pages of ranks 0 and 1 and controls the selection transistors of memory cells of these two linked pages, and paired control gate lines $CGL_0$ and $CGL_1$ are associated with respective ones of the same two linked pages, and control operation of their respective floating gate transistors. Similarly, a wordline of rank (I-2)(I-1) is associated with the two last pages of ranks I-2 and I-1 and controls the selection transistors of memory cells of these two linked pages, with paired control gate lines $CGL_{I-2}$ and $CGL_{I-1}$ controlling operation of their floating gate transistors as previously described.

The voltages applied to various control lines of the memory array are supplied by elements of the memory as a function of an address of a page to erase or of a group of memory cells to read or to program. These elements comprise:

bitline latches BLT that apply, to the different bitlines BL, the appropriate voltages BLV during the programming of memory cells, a wordline driver circuit WLDCT that applies, to the different wordlines WL, the voltages SV destined to the selection transistors, a gate control circuit CGCT0 that applies, to the different control gate lines CGL, the control gate voltages CGV of floating gate transistors, a source line switch SLS that applies the source line voltage SLV to the layer NISO, a well switch PWS that applies the substrate voltage VB to the well PW, sense amplifiers SA that apply, to the different bitlines BL, the appropriate voltages BLV during the read of memory cells, and supply a binary word read in the memory, for example a word of 8 bits B0-B7, and a column decoder CDEC that couples the sense amplifiers SA to the different bitlines.

The voltages supplied by these various elements are described by the tables RD4, ER2, PG2, and PG2'. In particular, the bitline latches BLT supply the "biasing voltage during the programming", or the "non-programming voltage" appearing in tables PG2 and PG2'. The sense amplifiers SA supply the "read biasing voltage" appearing in table RD4.

It will clearly appear to the skilled person that this memory structure comprising a wordline WL common to two rows of neighboring memory cells (for example pages $P_0$, $P_1$), in which the common wordline is coupled to gates of selection transistors ST31 of the first row and to gates of selection transistors ST32 of the second row, may be modified to receive memory cells C21, C22 of the type described above in relation with FIG. 5, in which the selection transistors ST21, ST22 do not comprise a common gate but share the same wordline WL.

Figure 24:
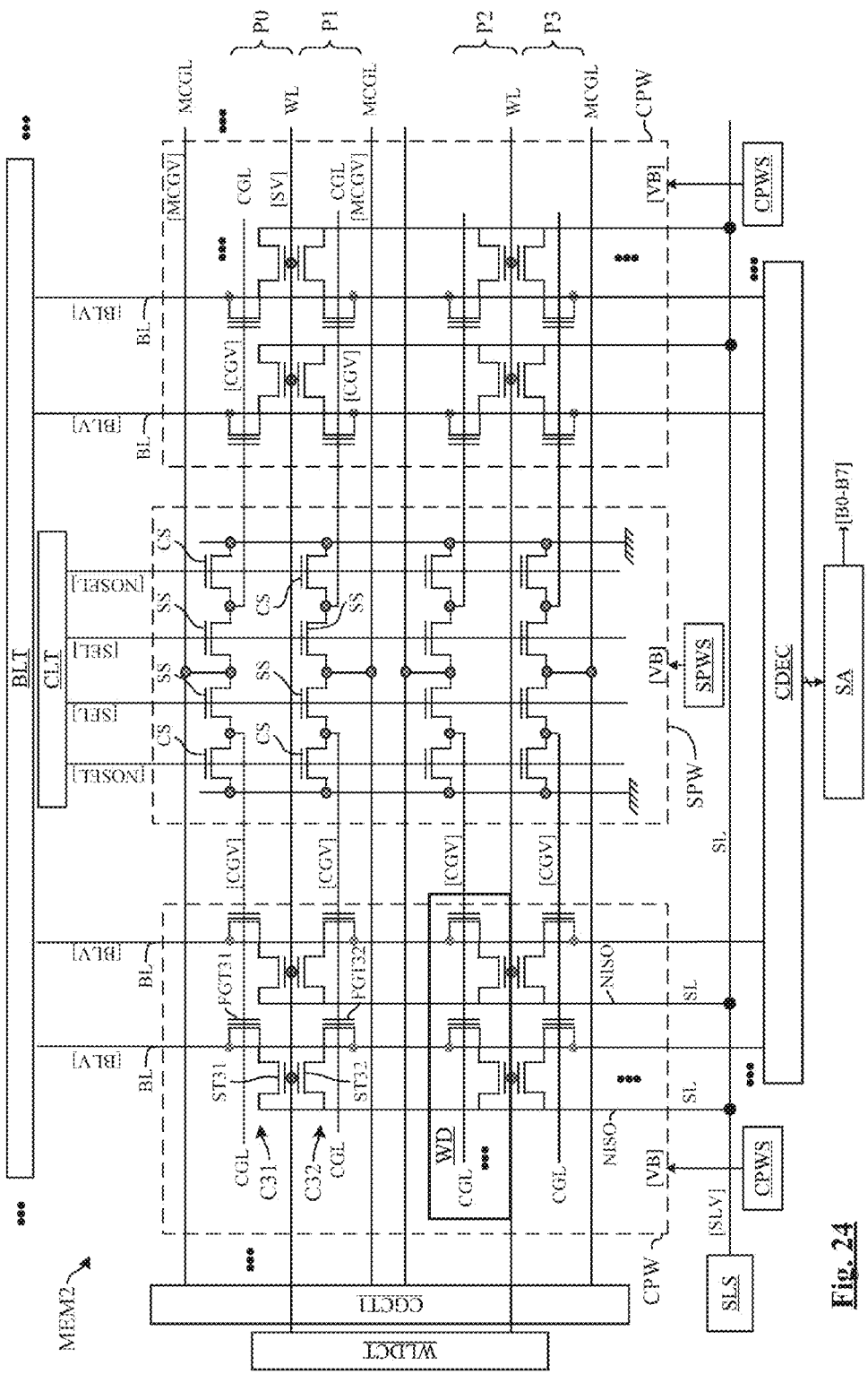
FIG. 24 is the electrical diagram of a word-erasable memory according to the disclosure.

FIG. 24 shows a word-erasable memory MEM2 comprising a memory array formed in a plurality of wells CPW, according to one embodiment. Each well CPW comprises memory cells C31, C32, each comprising a charge accumulation transistor FGT31, FGT32 in series with a selection transistor ST31, ST32. The memory also comprises wells SPW receiving control switches. The structure of the memory array is of the type CPW-SPW-CPW/CPW-SPW-CPW/CPW-SPW-CPW/ . . . , a control well SPW being associated with two wells CPW of memory cells and arranged between them. For reasons of clarity, FIG. 24 only shows one well SPW and two wells CPW. In a variation, the structure of the memory array could be of the type CPW-SPW/CPW-SPW/CPW-SPW/ . . . , by providing one control well SPW per memory cell well CPW.

The structure of each well CPW is similar to the structure of the memory array of the page-erasable memory MEM1 of FIG. 23, but the pages are replaced by words WD, that is to say, a group of memory cells containing a number of memory cells less than the number of memory cells of a page, for example 8 memory cells. A page of the memory MEM2 is thus comprised of a plurality of words WD, one of which is encircled in FIG. 24. FIG. 24 shows the first four pages $P_0$, $P_1$, $P_2$, $P_3$ of the memory array MEM2.

More particularly, each page comprises:

a plurality of words WD, distributed amongst the different wells CPW, control gate lines CGL, each attributed to a word WD and paired with a corresponding control gate line CGL attributed to a word WD of a neighboring linked page, a main control gate line MCGL that traverses the entire memory array and supplies a main control gate voltage MCGV to the different control gate lines CGL of that page, paired with a corresponding main control gate line MCGL of the neighboring page, and a wordline WL, shared with the neighboring, linked page, that traverses the entire memory array.

Each well CPW comprises a word WD of each page. Each memory cell of each word is coupled to a bitline BL, to the corresponding control gate line CGL common to all the memory cells of the word, to a wordline common to all the memory cells of the word as well as the memory cells of the neighboring word, and to the layer NISO of the well. By means of the control well SPW, the control gate line CGL of the word is coupled to the main control gate line MCGL of the page to which the word belongs.

The control well SPW comprises:
- a first vertical row of switch transistors CS controlled by a common signal NOSEL, provided to control the lines CGL of the cell wells located to the left of the control well,
- a first vertical row of switch transistors SS controlled by a common signal SEL, also provided to control the lines CGL of the cell wells located to the left of the control well,
- a second vertical row of switch transistors CS controlled by a common signal NOSEL, provided to control the lines CGL of the cell wells located to the right of the control well, and
- a second vertical row of switch transistors SS controlled by a common signal SEL, also provided to control the lines CGL of the cell wells located to the right of the control well.

More precisely, each switch CS couples a line CGL to ground, and each switch SS couples a line CGL to the main control gate line MCGL of the page to which the considered word belongs. The combination of signals SEL and NOSEL thus allow the line CGL to be coupled to ground or to the main control gate line MCGL.

The voltages applied to these various lines of the memory array are supplied by memory elements as a function of a selection address of a word to erase, read, or program. These elements comprise:
- bitline latches BLT, which apply, during the programming of memory cells, the appropriate voltages BLV to the different bitlines BL,
- a wordline driver circuit WLDCT, which applies the selection voltages SV destined to the selection transistors to the different wordlines WL,
- a control gate circuit CGCT1, which applies control gate voltages CGV to the different main control gate lines MCGL,
- column latches CLT, which supply the signals SEL and NOSEL to each vertical row of switches CS, SS.
- a source line switch SLS that applies the source line voltage SLV to the layer NISO of all the wells,
- a well switch CPWS per well CPW, which applies the substrate voltage VB to the well CPW,
- a well switch SPWS per well SPW, which applies the substrate voltage VB to the well SPW,
- sense amplifiers SA, which apply, during the read of memory cells, the appropriate voltages BLV to the different bitlines BL, and supply a binary word read in the memory, for example a word of 8 bits B0-B7, and
- a column decoder CDEC, which couples the sense amplifiers to the different bitlines.

Figure 25:
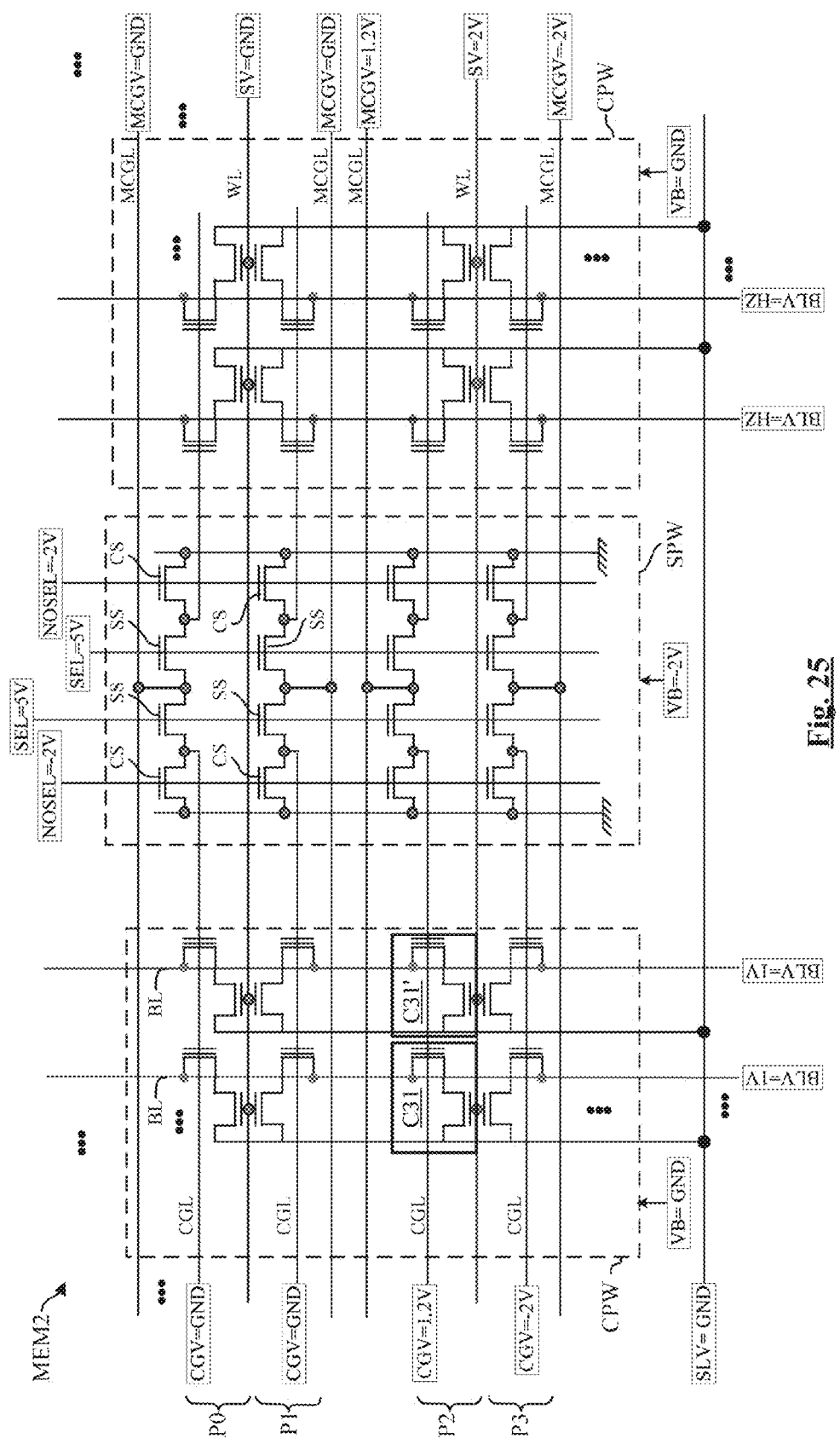
FIGS. 25, 26, and 27 show voltages applied to the memory of FIG. 24 during read, erase, and programming phases of memory cells.

The memory array thus arranged allows the read, erase, and program methods previously described to be applied to the memory cells. To get an idea, table RD5 in Annex describes, in relation with FIG. 25, voltage values applied to the memory array during the read of memory cells. FIG. 25 shows the distribution of these voltage values during the read of the two memory cells C31, C31', encircled in the drawing.

Figure 26:
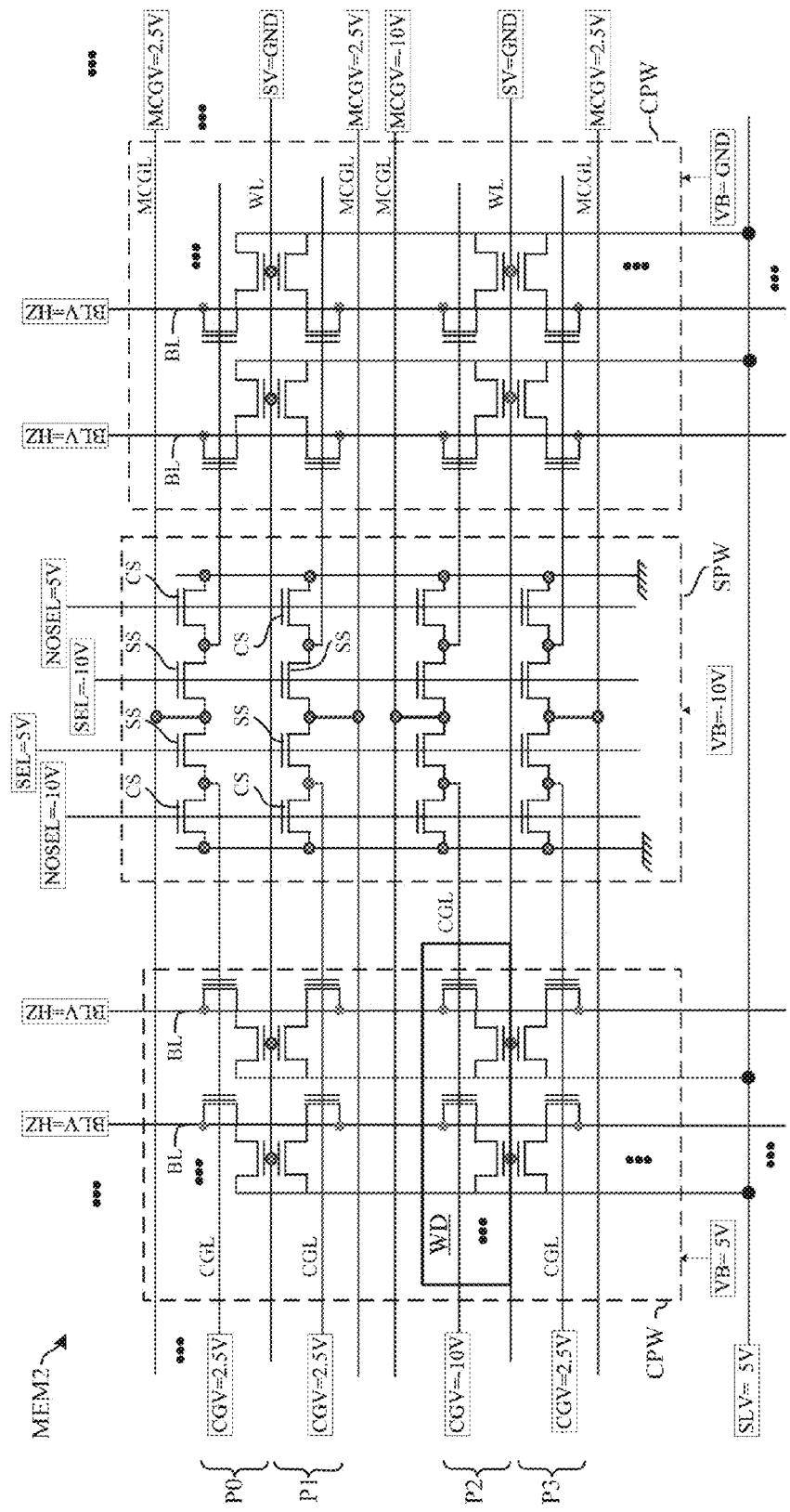

In relation with FIG. 26, table ER3 in Annex describes voltage values applied to the memory array during the erasure of a word. FIG. 26 shows the distribution of these voltage values during the erasure of a word WD encircled in the drawing.

Figure 27:
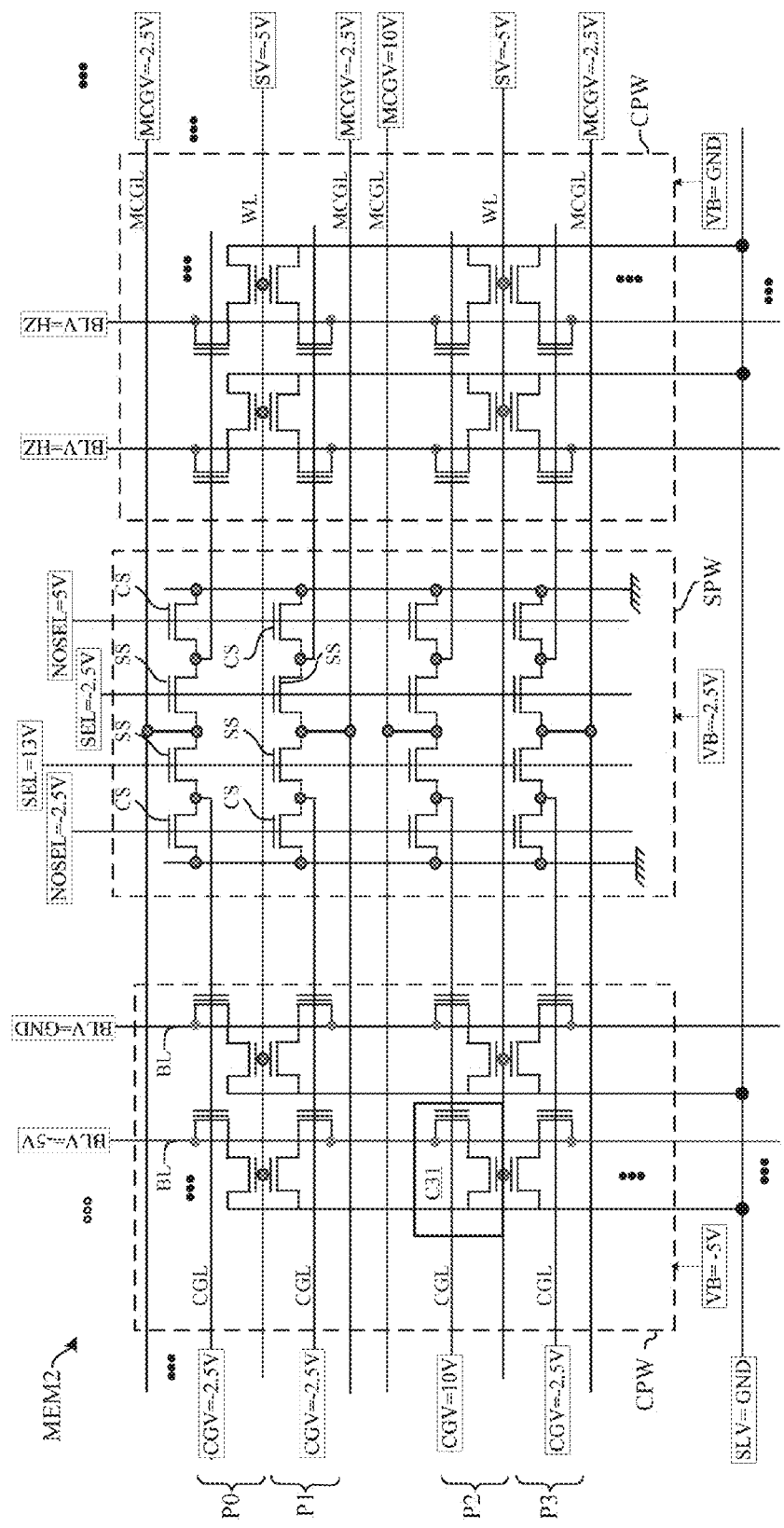

In relation with FIG. 27, table PG3 in Annex describes examples of voltage values applied to the memory array during the programming of a memory cell. FIG. 27 shows the distribution of these voltage values during the programming of a memory cell C31 encircled in the drawing.

It can be seen in the previously-cited tables that, during the erasure of a word, a main control gate line that is not selected but is paired with the selected main control gate line (i.e., that is associated with a page linked to the selected page) has a voltage different than that applied to a non-selected main control gate line that is not paired with the selected main control gate line. Similarly, during the read of the memory cells, a control gate line that is not selected but is paired with the selected control gate line has a voltage different than that applied to a non-selected control gate line that is not paired with the selected control gate line.

It will be understood by the skilled person that this memory structure comprising a wordline WL common to two rows of neighboring memory cells forming words WD, may be modified to receive memory cells C21, C22 of the type described above in relation with FIG. 5, of which the selection transistors ST21, ST22 do not comprise a common gate but share the same wordline WL.

Figure 28:
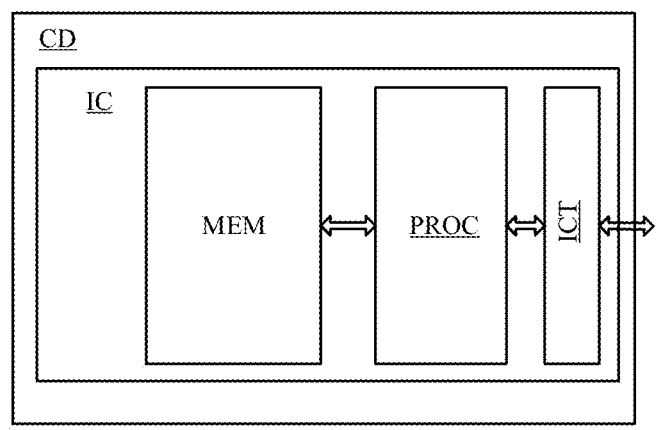
FIG. 28 shows an electronic device comprising a memory according to the disclosure.

FIG. 28 shows an application example of a memory MEM according to the disclosure (MEM1 or MEM2). The memory MEM is arranged in an integrated circuit IC equipped with a processor and a communication interface circuit ICT, for example an integrated circuit for a chipcard. The integrated circuit is mounted on a support CD, for example a plastic card. The memory MEM allows, for an identical memory capacity, to reduce the size and the cost price of integrated circuits, or, for an identical surface area, to increase the storage capacity of the memory.

It will also be understood by the skilled person that a memory cell according to the disclosure and a memory according to the disclosure are susceptible to various other implementations and applications. In particular, even though embodiments of memory cells with floating gate transistors have been described in the preceding, other types of charge accumulation transistors may be used, for example transistors comprising silicon dots embedded in a dielectric material, which allow the accumulation of electrical charges and may replace a floating gate.

Annex Forming an Integral Part of the Description
References Attributed to the Voltages

| REF1 | Voltages applied to the cells C11, C12 |
|---|---|
| BLV | Voltage applied to a bitline BL |
| CGV | Voltage applied to the control gate of a transistor FGT11, FGT12 |
| VB | Voltage applied to the substrate PW (well) |
| SV | Voltage applied to the gate of a transistor ST11, ST12 |
| SLV | Voltage applied to the source line SL |
| VI | Voltage applied to the isolation layer NISO |

-continued

| REF2 | Voltages applied to the cells C21, C22 | | |
|---|---|---|---|
| BLV | Voltage applied to a bitline BL | | |
| CGV | Voltage applied to the control gate of a transistor FGT21, FGT22 | | |
| VB | Voltage applied to the substrate PW (well) | | |
| SV | Voltage applied to the gate of a transistor ST21, ST22 | | |
| SLV | Voltage applied to the isolation layer NISO as a source line SL | | |
| REF3 | Voltages applied to the cells C31, C32 | | |
| BLV | Voltage applied to a bitline BL | | |
| CGV | Voltage applied to the control gate of a transistor FGT11, FGT12 | | |
| VB | Voltage applied to the substrate PW (well) | | |
| SV | Voltage applied to the common gate SGC of transistors ST31, T32 | | |
| SLV | Voltage applied to the isolation layer NISO as a source line SL | | |

Voltage Values Examples During the Read of a Memory Cell

| RD1 | Ref. | Ex. | Read of the cell C11 (Prior Art) |
|---|---|---|---|
| BLV | BLV1 | 1 V | Read biasing voltage |
| CGV | Vread | 1.2 V | Read voltage of the transistor FGT11 |
| CGV | Vnread | VB1 | Non-Read voltage applied to FGT12 |
| VB | VB1 | GND | Biasing voltage during the read |
| SV | Von | 2 V | Read selection voltage applied to ST11 |
| SV | Voff | GND | Read blocking voltage applied to ST12 |
| SLV | SLV1 | GND | Biasing voltage during the read |
| VI | VI1 | GND | Biasing voltage during the read |
| RD2 | Ref. | Ex. | Read of the cell C11 |
| BLV | BLV1 | 1 V | Read biasing voltage |
| CGV | Vread | 1.2 V | Read voltage of the transistor FGT11 |
| CGV | Vinh | −2 V | Inhibition voltage of the transistor FGT12 |
| VB | VB1 | GND | Biasing voltage during the read |
| SV | Von | 2 V | Read selection voltage of the transistors ST11, ST12 |
| SLV | SLV1 | GND | Biasing voltage during the read |
| VI | VI1 | GND | Biasing voltage during the read |
| RD3 | Ref. | Ex. | Read of the cell C21 |
| BLV | BLV1 | 1 V | Read biasing voltage |
| CGV | Vread | 1.2 V | Read voltage of the transistor FGT21 |
| CGV | Vinh | −2 V | Inhibition voltage of the transistor FGT22 |
| VB | VB1 | GND | Biasing voltage during the read |
| SV | Von | 2 V | Read selection voltage of the transistors ST21, T22 |
| SLV | SLV1 | GND | Biasing voltage during the read |
| RD4 | Ref. | Ex. | Read of the cell C31 |
| BLV | BLV1 | 1 V | Read biasing voltage |
| CGV | Vread | 1.2 V | Read voltage of the transistor FGT31 |
| CGV | Vinh | −2 V | Inhibition voltage of the transistor FGT32 |
| VB | VB1 | GND | Biasing voltage during the read |
| SV | Von | 2 V | Read selection voltage of the transistors ST31, T32 |
| SLV | VI1 | GND | Biasing voltage during the read |

Voltage Value Examples During the Erasure of a Memory Cell

| ER1 | Ref. | Ex. | Erasure of the cell C11 (Prior Art) |
|---|---|---|---|
| BLV | BLV2 | HZ | Biasing voltage during erasure |
| CGV | Ver | −10 V | Erase voltage of the transistor FGT11 |
| CGV | Vner | 2.5 V | Non-erase voltage of the transistor FGT12 |
| VB | VB2 | 5 V | Biasing voltage during erasure |
| SV | SV2 | 5 V | Biasing voltage during erasure |
| SLV | SLV2 | HZ | Biasing voltage during erasure |
| VI | VI2 | 5 V | Biasing voltage during erasure |
| ER2 | Ref. | Ex. | Erasure of the cell C31, FIG. 11 |
| BLV | BLV2 | HZ | Biasing voltage during erasure |
| CGV | Ver | −10 V | Erase voltage of the transistor FGT31 |
| CGV | Vner | 2.5 V | Non-erase voltage of the transistor FGT32 |
| VB | VB2 | 5 V | Biasing voltage during erasure |
| SV | SV2 | 5 V | Biasing voltage during erasure |
| SLV | VI2 | 5 V | Biasing voltage during erasure |

Voltage Value Examples During the Programming of a Memory Cell

| PG1 | Ref. | Ex. | Programming of the cell C11 (Prior Art) |
|---|---|---|---|
| BLV | BLV3 | −5 V | Biasing voltage during the programming |
| CGV | Vprog | 10 V | Programming voltage of the transistor FGT11 |
| CGV | Vnprog | −2.5 V | Non-programming voltage of the transistor FGT12 |
| VB | VB3 | −5 V | Biasing voltage during the programming |
| SV | SV3 | −5 V | Biasing voltage during the programming |
| SLV | SLV3 | HZ | Biasing voltage during the programming |
| VI | VI3 | GND | Biasing voltage during the programming |
| PG2 | Ref. | Ex. | Programming of the cell C31, FIG. 12 |
| BLV | BLV3 | −5 V | Biasing voltage during the programming |
| CGV | Vprog | 10 V | Programming voltage of the transistor FGT31 |
| CGV | Vnprog | −2.5 V | Non-programming voltage of the transistor FGT32 |
| VB | VB3 | −5 V | Biasing voltage during the programming |
| SV | SV3 | −5 V | Biasing voltage during the programming |
| SLV | VI3 | GND | Biasing voltage during the programming |
| PG2' | Ref. | Ex. | Voltages sustained by a neighboring cell |
| BLV | BLV3' | GND | Non-programming voltage |
| CGV | Vprog | 10 V | Voltage sustained by the transistor FGT31' |
| CGV | Vnprog | −2.5 V | Voltage sustained by the transistor FGT32' |
| VB | VB3 | −5 V | Biasing voltage during the programming |
| SV | SV3 | −5 V | Voltage sustained by the transistors ST31', ST32' |
| SLV | VI3 | GND | Biasing voltage during the programming |

Voltage Value Examples During the Read of a Memory Cell (FIG. 25)

| RD5 Voltage | Line | Value | Status |
|---|---|---|---|
| BLV | BL | 1 V | Selected bitline (BL) |
| BLV | BL | HZ | Non-selected bitline |
| MCGV | MCGL | 1.2 V | Selected main control gate line |
| MCGV | MCGL | −2 V | Non-selected main control gate line paired with the selected main control gate line |
| MCGV | MCGL | GND | Non-selected main control gate line pairs |
| CGV | CGL | 1.2 V | Selected control gate line |
| CGV | CGL | −2 V | Non-selected control gate line paired with the selected control gate line |
| CGV | CGL | GND | Non-selected control gate line not paired with the selected control gate line |

| RD5 Voltage | Line | Value | Status |
|---|---|---|---|
| VB | — | GND | Selected well |
| VB | — | GND | Non-selected well |
| VB | — | −2 V | Switch well SS, CS |
| SV | WL | 2 V | Selected wordline |
| SV | WL | GND | Non-selected wordline |
| SLV | NISO | GND | Voltage of the source line and of layer NISO |
| SEL | — | 5 V | Control of switches SS of the selected well |
| NOSEL | — | −2 V | Control of switches CS of the selected well |
| SEL | — | 5 V | Control of switches SS of the non-selected well |
| NOSEL | — | −2 V | Control of switches CS of the non-selected well |

Voltage Value Examples During Erasure of a Word (FIG. 26)

| ER3 Voltage | Line | Value | Status |
|---|---|---|---|
| BLV | BL | HZ | Selected bitline (BL) |
| BLV | BL | HZ | Non-selected bitline |
| MCGV | MCGL | −10 V | Selected main control gate line |
| MCGV | MCGL | 2.5 V | Non-selected main control gate line paired with the selected main control gate line |
| MCGV | MCGL | 2.5 V | Non-selected main control gate line not paired with the selected control gate line |
| CGV | CGL | −10 V | Selected control gate line |
| CGV | CGL | 2.5 V | Non-selected control gate line paired with the selected control gate line |
| CGV | CGL | 2.5 V | Non-selected control gate line in selected well, not paired with the selected control gate line |
| CGV | CGL | GND | Non-selected control gate line in non-selected well |
| VB | — | 5 V | Selected well |
| VB | — | GND | Non-selected well |
| VB | — | −10 V | Switch well SS, CS |
| SV | WL | GND | Selected wordline |
| SV | WL | GND | Non-selected wordline |
| SLV | NISO | 5 V | Voltage of the source line and of layer NISO |
| SEL | — | 5 V | Control of switches SS of the selected well |
| NOSEL | — | −10 V | Control of switches CS of the selected well |
| SEL | — | −10 V | Control of switches SS of the non-selected well |
| NOSEL | — | 5 V | Control of switches CS of the non-selected well |

Voltage Value Examples During the Programming of a Word (FIG. 27)

| PG3 Voltage | Line | Value | Status |
|---|---|---|---|
| BLV | BL | −5 V | Selected bitline (BL) |
| BLV | BL | GND | Non-selected bitline in selected cell |
| BLV | BL | HZ | Non-selected bitline in non-selected well |
| MCGV | MCGL | 10 V | Selected main control gate line |
| MCGV | MCGL | −2.5 V | Non-selected main control gate line paired with the selected main control gate line |
| MCGV | MCGL | −2.5 V | Non-selected main control gate line not paired with the selected main control gate line |
| CGV | CGL | 10 V | Selected control gate line |
| CGV | CGL | −2.5 V | Non-selected control gate line paired with the selected control gate line |
| CGV | CGL | −2.5 V | Non-selected control gate line in selected well, not paired with the selected control gate line |
| CGV | CGL | GND | Non-selected control gate line in non-selected well |
| VB | — | −5 V | Selected well |
| VB | — | GND | Non-selected well |
| VB | — | −2.5 V | Switch well SS, CS |
| SV | WL | −5 V | Selected wordline |
| SV | WL | −5 V | Non-selected wordline |
| SLV | NISO | GND | Voltage of the source line and of layer NISO |
| SEL | — | 13 V | Control of switches SS of the selected well |
| NOSEL | — | −2.5 V | Control of switches CS of the selected well |
| SEL | — | −2.5 V | Control of switches SS of the non-selected well |
| NOSEL | — | 5 V | Control of switches CS of the non-selected well |

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
reading a first memory cell of an array of memory cells each having a charge accumulation transistor in series with a selection transistor, the reading including:
applying a read biasing voltage to a bitline to which the first memory cell and a second memory cell of the array are electrically coupled;
applying, via a first wordline electrically coupled to the first and second memory cells, a positive selection voltage to respective gates of the selection transistors of the first and second memory cells;
applying a read voltage to a control gate of the charge accumulation transistor of the first memory cell; and
sensing a current flowing in the memory cell;
maintaining the charge accumulation transistor of the second memory cell in a blocked state while reading the first memory cell by applying a negative inhibition voltage to a control gate of the charge accumulation transistor of the second memory cell; and
applying a null voltage to control gates of the charge accumulation transistors of third and fourth memory cells of the array which are electrically coupled to a second wordline.

2. A method according to claim 1, wherein the third and fourth memory cells are electrically coupled to the same bitline to which the first and second memory cells are electrically coupled.

3. A method according to claim 1, wherein the substrate is a well delimited by an isolation layer, comprising using the isolation layer as a source line of the selection transistors of the memory cells of the array.

4. A method according to claim 1, wherein the gate of the selection transistor of the first memory cell and the gate of the selection transistor of the second memory cell are a common gate that extends longitudinally vertically in the semiconductor substrate, and reading the first memory cell includes causing a current to flow through a conductive channel of the selection transistor of the first memory cell extending in front of a first face of the common gate; the method further comprising:

reading the second memory cell, during which a current flows through a conductive channel of the selection transistor of the second memory cell extending in front of a second face of the common gate.

5. A method according to claim 1, comprising erasing the first memory cell, the erasing including:

applying an erasure biasing voltage to the substrate;

causing an electrical field to appear between the substrate and the control gate, and extracting electrical charges by tunnel effect, by applying an erasure voltage to the control gate of the charge accumulation transistor of the first memory cell;

applying an erasure inhibition voltage to the control gate of the charge accumulation transistor of the second memory cell; and applying a same voltage to the gate of the selection transistor of the first memory cell and to the gate of the selection transistor of the second memory cell.

6. A method according to claim 1, comprising programming the first memory cell, the programming including:

applying an erase biasing voltage to the substrate;

causing an electrical field to appear between the control gate and the substrate to inject electrical charges by tunnel effect by applying a programming voltage to the control gate of the charge accumulation transistor of the first memory cell;

applying a programming inhibition voltage to the control gate of the charge accumulation transistor of the second memory cell; and applying a same voltage to the gate of the selection transistor of the first memory cell and to the gate of the selection transistor of the second memory cell.

7. A method according to claim 1, wherein the memory array includes first and second rows of memory cells and a common wordline coupled to the gates of the selection transistors of memory cells of the first row and of the second row, the method comprising:

applying, via the common wordline, a same voltage to the gates of selection transistors of memory cells of the first row and of the second row during reading, erasing, and programming of the memory cells of one of the first and second rows.

8. An integrated circuit comprising:

a memory on a semiconductor substrate, the memory including:

first, second, third, and fourth memory cells, each including a charge accumulation transistor in series with a selection transistor;

a first wordline electrically coupled to the first and second memory cells;

a second wordline electrically coupled to the third and fourth memory cells;

a bitline electrically coupled to the first and second memory cells; and read circuitry configured to read the first memory cell by:

applying a read biasing voltage to the bitline;

applying, via the first wordline, a positive selection voltage to respective gates of the selection transistors of the first and second memory cells;

applying a read voltage to a control gate of the charge accumulation transistor of the first memory cell;

sensing a current flowing in the memory cell;

maintaining the charge accumulation transistor of the second memory cell in a blocked state by applying a negative inhibition voltage to a control gate of the charge accumulation transistor of the second memory cell; and applying a null voltage to control gates of the charge accumulation transistors of the third and fourth memory cells.

9. An integrated circuit according to claim 8, wherein the bitline is electrically coupled to the third and fourth memory cells.

10. An integrated circuit according to claim 8, wherein:

the memory cells are implanted in a well of the substrate; and the memory includes an isolation layer delimiting the well and forming a source line of selection transistors of the memory cells.

11. An integrated circuit according to claim 8, wherein the memory comprises a buried vertical gate forming a common gate of the selection transistor of the first memory cell and of the selection transistor of the second memory cell, the selection transistor of the first memory cell includes a channel region extending in front of a first face of the common gate, and the selection transistor of the second memory cell includes a channel region extending in front of a second face of the common gate.

12. An integrated circuit according to claim 8, wherein the memory comprises:

first and second rows of memory cells each including a charge accumulation transistor in series with a selection transistor;

a common wordline coupled to gates of the selection transistors of memory cells of the first row and of the second row, wherein the read circuitry is configured to apply the same voltage to the gates of the selection transistors of memory cells of the first row and of the second row via the common wordline, during reading of the memory cells of one of the first and second rows.

13. An integrated circuit according to claim 8, wherein the memory includes:

a first row of memory cells each including a charge accumulation transistor in series with a selection transistor;

a first control gate line coupled to the charge accumulation transistors of memory cells of the first row;

a second control gate line coupled to the charge accumulation transistors of memory cells of the second row; and wherein the read circuitry includes erase circuitry configured to concurrently erase the first row of memory cells by:

applying an erase biasing voltage to the substrate;

applying an erase voltage to the first control gate line; and applying an erase inhibition voltage to the second control gate line.

14. An integrated circuit according to claim 8, wherein the memory includes:

a row having first and second groups of memory cells, each memory cell including a charge accumulation transistor in series with a selection transistor, the memory being configured to allow simultaneous erasure of the first group of memory cells without erasing the memory cells of the second group;

first and second wells in which are positioned the first and second groups, respectively;

a main control gate line for the memory cells of the row; and first and second control gate lines coupled to the first and second groups, respectively, each control gate line coupled to the charge accumulation transistors of the memory cells of the respective group.

15. An integrated circuit according to claim 14, wherein the memory comprises first and second selection switches coupled to the first and second groups of memory cells, respectively, the first selection switch being configured to couple the main control gate line to the first control gate line, and the first selection switch being configured to couple the main control gate line to the first control gate line, the selection switches being arranged in a dedicated well distinct from wells in which are arranged the groups of memory cells.

16. An integrated circuit according to claim 8, further comprising a processor coupled to the memory.

17. An apparatus comprising:

a support; and an integrated circuit mounted on the support, the integrated circuit including:

a memory on a semiconductor substrate, the memory including:

first, second, third, and fourth memory cells, each including a charge accumulation transistor in series with a selection transistor;

a first wordline electrically coupled to the first and second memory cells;

a second wordline electrically coupled to the third and fourth memory cells;

a bitline electrically coupled to the first and second memory cells; and read circuitry configured to read the first memory cell by:

applying a read biasing voltage to the bitline;

applying, via the first wordline, a positive selection voltage to respective gates of the selection transistors of the first and second memory cells;

applying a read voltage to a control gate of the charge accumulation transistor of the first memory cell;

sensing a current flowing in the memory cell;

maintaining the charge accumulation transistor of the second memory cell in a blocked state by applying a negative inhibition voltage to a control gate of the charge accumulation transistor of the second memory cell; and applying a null voltage to control gates of the charge accumulation transistors of the third and fourth memory cells.

18. An apparatus according to claim 17, wherein the bitline is electrically coupled to the third and fourth memory cells.

19. An apparatus according to claim 17, wherein:

the memory cells are implanted in a well of the substrate; and the memory includes an isolation layer delimiting the well and forming a source line of selection transistors of the memory cells.

20. An apparatus according to claim 17, wherein the memory comprises a buried vertical gate forming a common gate of the selection transistor of the first memory cell and of the selection transistor of the second memory cell, the selection transistor of the first memory cell includes a channel region extending in front of a first face of the common gate, and the selection transistor of the second memory cell includes a channel region extending in front of a second face of the common gate.

* * * * *